(12) United States Patent
Kim et al.

(10) Patent No.: US 9,673,208 B2
(45) Date of Patent: Jun. 6, 2017

(54) METHOD OF FORMING MEMORY ARRAY AND LOGIC DEVICES

(71) Applicant: Silicon Storage Technology, Inc., San Jose, CA (US)

(72) Inventors: Jinho Kim, Saratoga, CA (US); Chien-Sheng Su, Saratoga, CA (US); Feng Zhou, Fremont, CA (US); Xian Liu, Sunnyvale, CA (US); Nhan Do, Saratoga, CA (US); Prateep Tuntasood, San Jose, CA (US); Parviz Ghazavi, San Jose, CA (US)

(73) Assignee: Silicon Storage Technology, Inc., San Jose, CA (US)

(*) Notice: Subject to any disclaimer, the term of this patent is extended or adjusted under 35 U.S.C. 154(b) by 0 days.

(21) Appl. No.: 15/264,457

(22) Filed: Sep. 13, 2016

(65) Prior Publication Data

US 2017/0103991 A1    Apr. 13, 2017

Related U.S. Application Data

(60) Provisional application No. 62/240,389, filed on Oct. 12, 2015.

(51) Int. Cl.
*H01L 27/115* (2006.01)
*H01L 29/66* (2006.01)
*H01L 27/11531* (2017.01)

(52) U.S. Cl.
CPC .............................. *H01L 27/11531* (2013.01)

(58) Field of Classification Search
CPC ......... H01L 27/11531; H01L 27/11526; H01L 27/11546; H01L 27/105; H01L 27/11524; H01L 29/42328; H01L 29/66484
See application file for complete search history.

(56) References Cited

U.S. PATENT DOCUMENTS

| 5,242,848 | A  | 9/1993  | Yeh          |
|-----------|----|---------|--------------|
| 6,204,159 | B1 | 3/2001  | Chang et al. |
| 6,747,310 | B2 | 6/2004  | Fan et al.   |
| 7,294,548 | B2 | 11/2007 | Lee et al.   |
| 7,868,375 | B2 | 1/2011  | Liu et al.   |
| 7,927,994 | B1 | 4/2011  | Liu et al.   |
| 8,008,702 | B2 | 8/2011  | Wang et al.  |
| 8,101,477 | B1 | 1/2012  | Power        |
| 8,138,524 | B2 | 3/2012  | Kotov et al. |
| 8,883,592 | B2 | 11/2014 | Kotov et al. |
| 8,927,370 | B2 | 1/2015  | Lo et al.    |
| 9,276,006 | B1 | 3/2016  | Chen et al.  |
| 9,379,121 | B1 | 6/2016  | Chen et al.  |

(Continued)

*Primary Examiner* — Mamadou Diallo
(74) *Attorney, Agent, or Firm* — DLA Piper LLP (US)

(57) ABSTRACT

A method of forming a memory device on a substrate having memory, core and HV device areas. The method includes forming a pair of conductive layers in all three areas, forming an insulation layer over the conductive layers in all three areas (to protect the core and HV device areas), and then etching through the insulation layer and the pair of conductive layers in the memory area to form memory stacks. The method further includes forming an insulation layer over the memory stacks (to protect the memory area), removing the pair of conductive layers in the core and HV device areas, and forming conductive gates disposed over and insulated from the substrate in the core and HV device areas.

20 Claims, 33 Drawing Sheets

(56) References Cited

U.S. PATENT DOCUMENTS

| | | | |
|---|---|---|---|
| 2005/0130372 A1* | 6/2005 | Lee | H01L 27/105 |
| | | | 438/257 |
| 2006/0046385 A1* | 3/2006 | Fujii | G11C 16/18 |
| | | | 438/257 |
| 2006/0154421 A1* | 7/2006 | Choi | H01L 21/26586 |
| | | | 438/265 |
| 2009/0045445 A1* | 2/2009 | Yang | H01L 27/105 |
| | | | 257/299 |
| 2009/0166708 A1 | 7/2009 | Io | |
| 2009/0250726 A1* | 10/2009 | Kurjanowicz | H01L 23/5252 |
| | | | 257/209 |
| 2012/0241871 A1* | 9/2012 | Lin | H01L 21/823456 |
| | | | 257/392 |
| 2013/0207174 A1 | 8/2013 | Wang | |
| 2014/0097482 A1 | 4/2014 | Tokunaga et al. | |
| 2015/0228739 A1* | 8/2015 | Tang | H01L 29/42324 |
| | | | 257/319 |

* cited by examiner

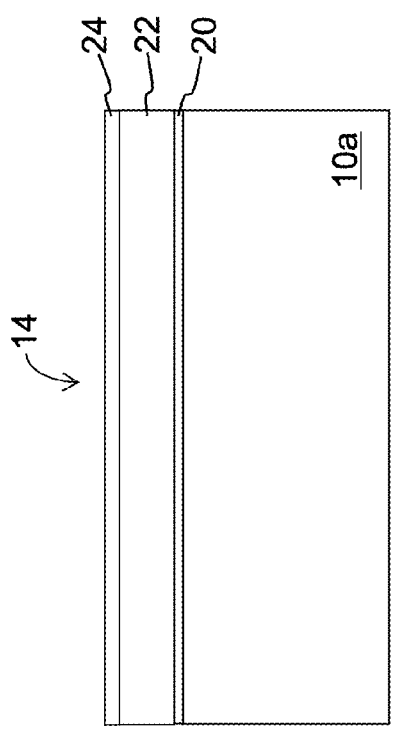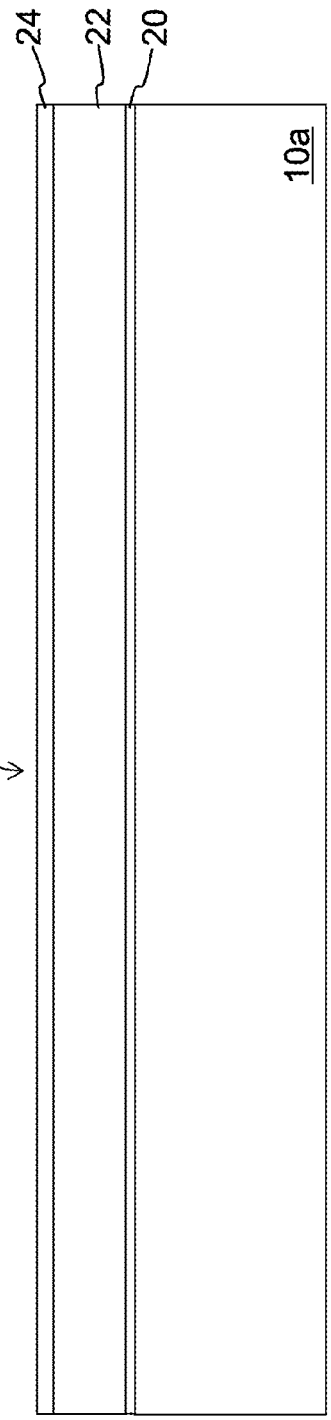

METHOD OF FORMING MEMORY ARRAY AND LOGIC DEVICES

RELATED APPLICATIONS

This application claims the benefit of U.S. Provisional Application No. 62/240,389, filed Oct. 12, 2015, and which is incorporated herein by reference.

FIELD OF THE INVENTION

The present invention relates to non-volatile flash memory devices, and more particularly to an array of flash memory embedded on the same chip as core and high voltage logic devices.

BACKGROUND OF THE INVENTION

Split gate non-volatile memory devices are well known in the art. For example, U.S. Pat. No. 7,927,994 discloses a split gate non-volatile memory cell. Currently, it is known to form non-volatile flash memory cells on the same chip as other logic devices, such as low voltage logic devices (core devices) and higher voltage logic devices (HV devices). It is also known to make the memory cell gates and/or the gates of the logic devices of a high K metal material (HKMG—a high K dielectric layer underneath a metal layer). However, separate masking and processing steps are typically used to separately form the memory cells, the core devices and the HV devices, and the process steps for forming devices in one area of the substrate can adversely affect the devices formed in other areas of the substrate.

The present invention is a technique for forming a split gate non-volatile memory device on the same chip as logic devices to minimize the mutual impact and be compatible between flash memory and logic/HV devices.

BRIEF SUMMARY OF THE INVENTION

The aforementioned problems and needs are addressed by a method of forming a memory device that includes providing a semiconductor substrate having a memory array area, a core device area and an HV device area; forming a first conductive layer over and insulated from the substrate in the memory array, core device, and HV device areas; forming a second conductive layer over and insulated from the first conductive layer in the memory array, core device, and HV device areas; forming a first insulation layer over the second conductive layer in the memory array, core device, and HV device areas; etching through portions of the first insulation layer and the first and second conductive layers in the memory array area to form pairs of stacks, wherein each of the stacks includes a block of the second conductive layer over and insulated from a block of the first conductive layer; forming source regions in the substrate, wherein each of the source regions is disposed between the stacks of one of the pairs of stacks; forming a third conductive layer in the memory array, core device and HV device areas; removing the third conductive layer from the core device and HV device areas; forming a second insulation layer over the third conductive layer in the memory array area and over the first insulation layer in the core device and HV device areas; removing the first and second insulation layers, and the first and second conductive layers, from the core device and HV device areas; forming conductive gates disposed over and insulated from the substrate in the core device and HV device areas; removing the second insulation layer in the memory array area; removing portions of the third conductive layer to form blocks of the third conductive layer adjacent to and insulated from the pairs of stacks; forming drain regions in the substrate adjacent the blocks of the third conductive layer in the memory array area; and forming second source and second drain regions in the substrate adjacent the conductive gates in the core device and HV device areas.

A method of forming a memory device includes providing a semiconductor substrate having a memory array area, a core device area and an HV device area; forming a first conductive layer over and insulated from the substrate in the memory array, core device, and HV device areas; forming a second conductive layer over and insulated from the first conductive layer in the memory array, core device, and HV device areas; forming a first insulation layer over the second conductive layer in the memory array, core device, and HV device areas; etching through portions of the first insulation layer and the first and second conductive layers in the memory array area to form pairs of stacks, wherein each of the stacks includes a block of the second conductive layer over and insulated from a block of the first conductive layer; forming source regions in the substrate, wherein each of the source regions is disposed between the stacks of one of the pairs of stacks; forming a third conductive layer in the memory array, core device and HV device areas; removing the third conductive layer from the core device and HV device areas; forming a second insulation layer over the third conductive layer in the memory array area and over the first insulation layer in the core device and HV device areas; removing the first and second insulation layers, and the first and second conductive layers, from the core device and HV device areas; forming a fourth conductive layer disposed over and insulated from the substrate in the core device and HV device areas; removing the second insulation layer in the memory array area; removing portions of the third conductive layer to form blocks of the third conductive layer adjacent to and insulated from the pairs of stacks; removing portions of the fourth conductive layer to form conductive gates disposed over and insulated from the substrate in the core device and HV device areas; forming drain regions in the substrate adjacent the blocks of the third conductive layer in the memory array area; and forming second source and second drain regions in the substrate adjacent the conductive gates in the core device and HV device areas.

Other objects and features of the present invention will become apparent by a review of the specification, claims and appended figures.

BRIEF DESCRIPTION OF THE DRAWINGS

FIGS. 2A-14A are side cross sectional views of the memory array area portion of the substrate (in the word line (WL) direction), illustrating the steps of forming the memory cells.

FIGS. 2B-14B are side cross sectional views of the memory array area portion of the substrate (in the bit line (BL) direction) illustrating, the steps of forming the memory cells.

FIGS. 2C-14C are cross sectional views of the core device area portion of the substrate, illustrating the steps of forming the core devices.

FIGS. 2D-14D are cross sectional views of the HV device area portion of the substrate, illustrating the steps of forming the HV devices.

FIGS. 15A-17A are side cross sectional views of the memory array area portion of the substrate (in the word line (WL) direction), illustrating an alternate embodiment of the steps of forming the memory cells.

FIGS. 15B-17B are side cross sectional views of the memory array area portion of the substrate (in the bit line (BL) direction), illustrating an alternate embodiment of the steps of forming the memory cells.

FIGS. 15C-17C are cross sectional views of the core device area portion of the substrate, illustrating an alternate embodiment of the steps of forming the core devices.

FIGS. 15D-17D are cross sectional views of the HV device area portion of the substrate, illustrating an alternate embodiment of the steps of forming the HV devices.

DETAILED DESCRIPTION OF THE INVENTION

The present invention is an improved process in concurrently forming memory array, core and HV devices on the same chip. It has been discovered that by forming and keeping some of the material layers used in forming the memory device formation in the core and HV device portions of the substrate longer in the process, and by covering up the memory array with insulation during formation of core and HV devices, the memory array formation processing is more compatible with forming the core and HV devices with a lower mask count. Presently, as memory and logic devices are shrinking in size and the processes are getting more complicated, minimizing thermal budget, reducing impacts on one another and obtaining similar topologies becomes critical in the embedded process. The present invention can offer these processes and results with better compatibility.

Figure 1:
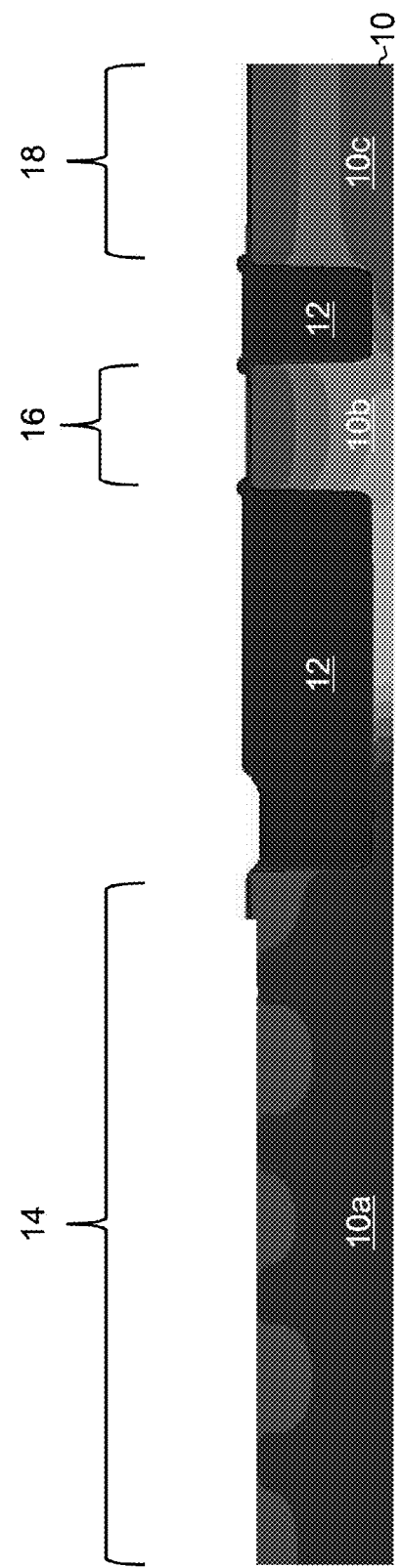
FIG. 1 is a side cross sectional view of the memory array, core device and HV device areas of the substrate.
Figure 2C:
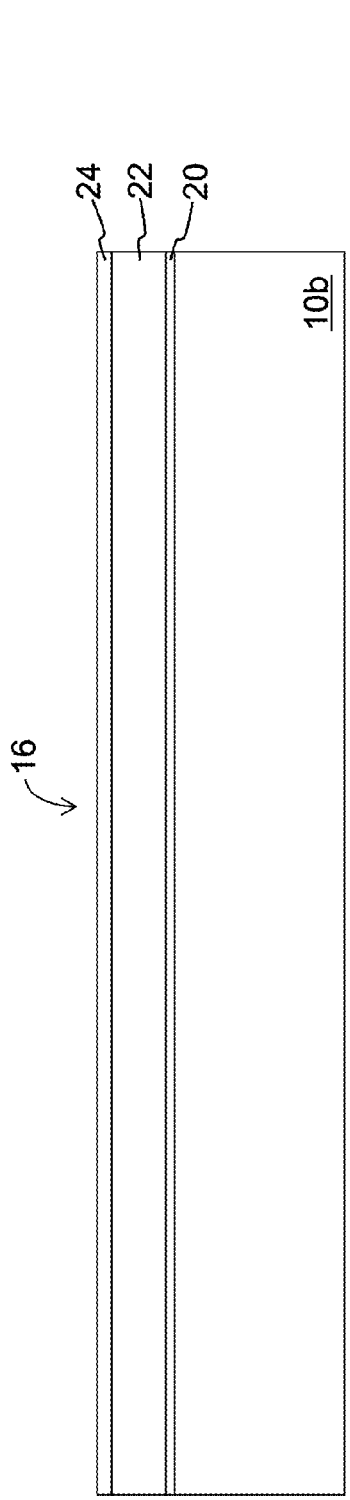
Figure 2D:
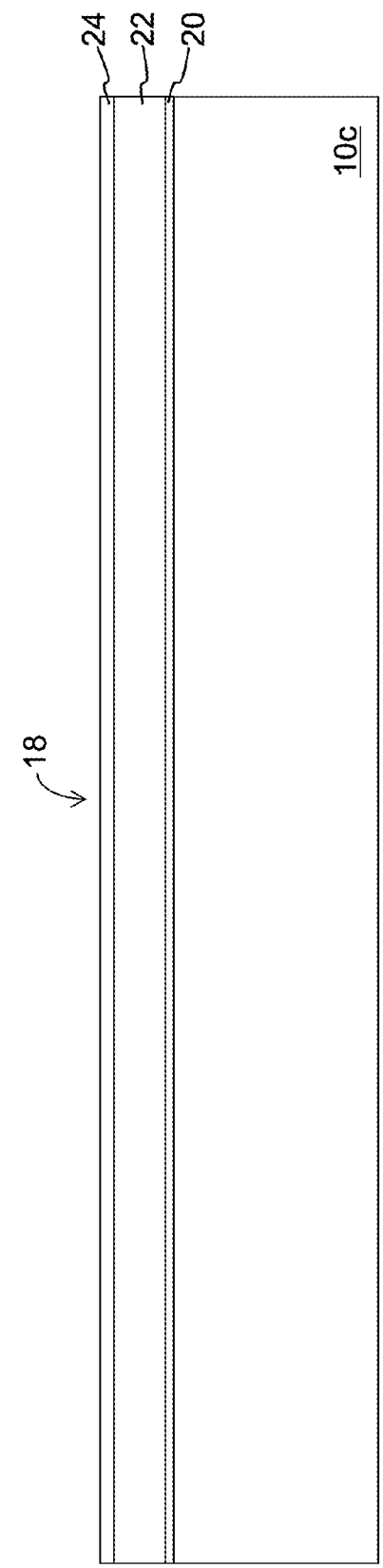
Figure 3A:
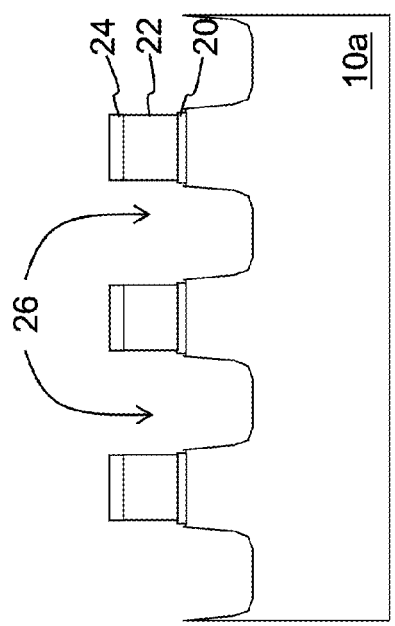
Figure 3B:
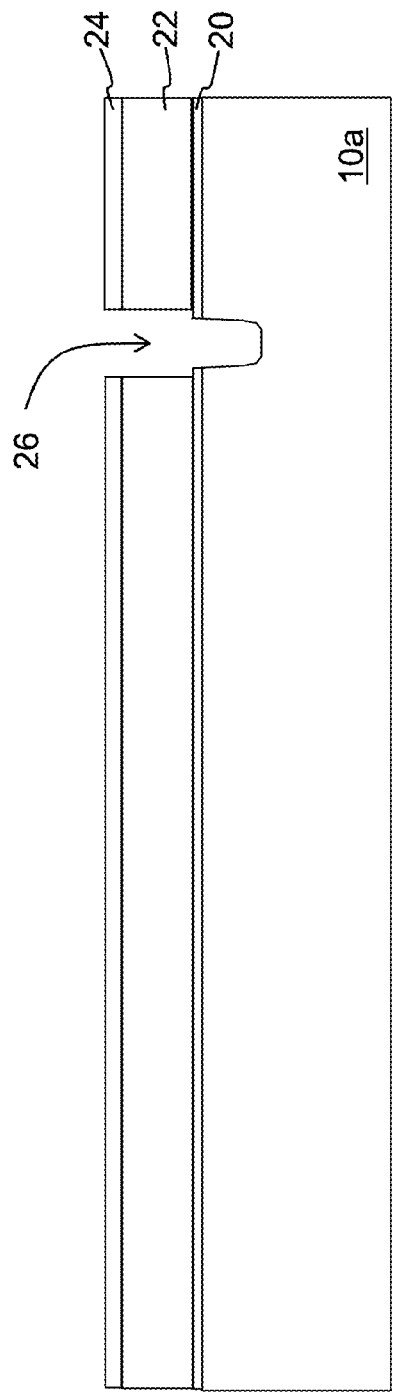
Figure 3C:
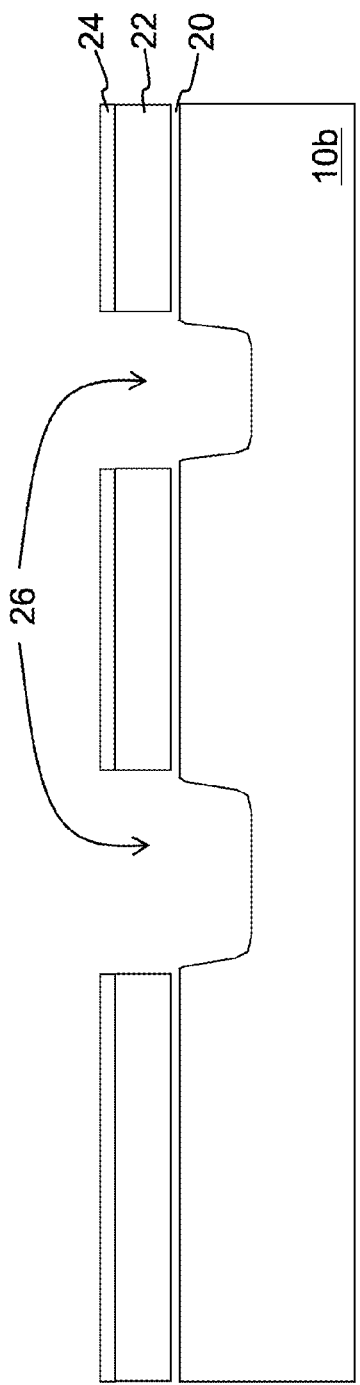
Figure 3D:
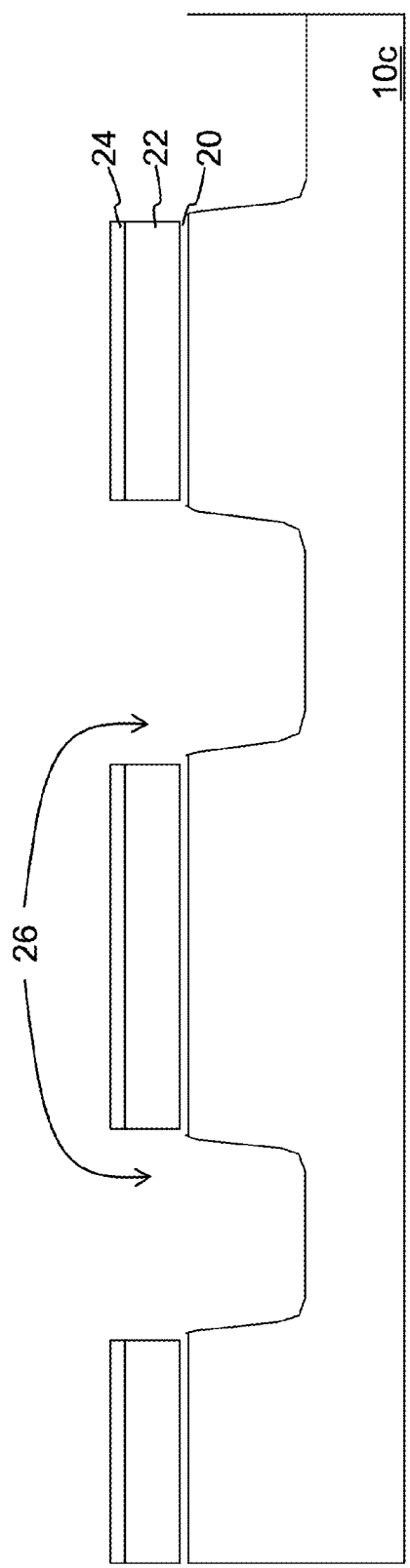
Figure 4A:
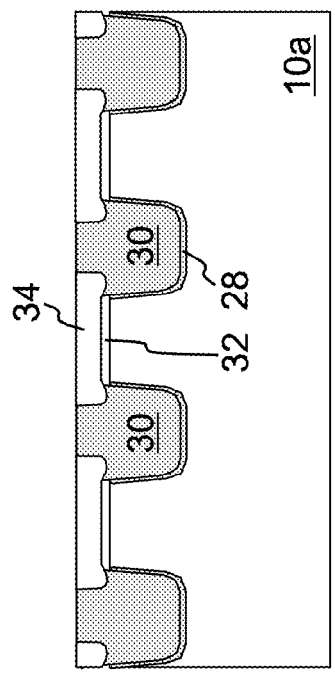
Figure 4B:
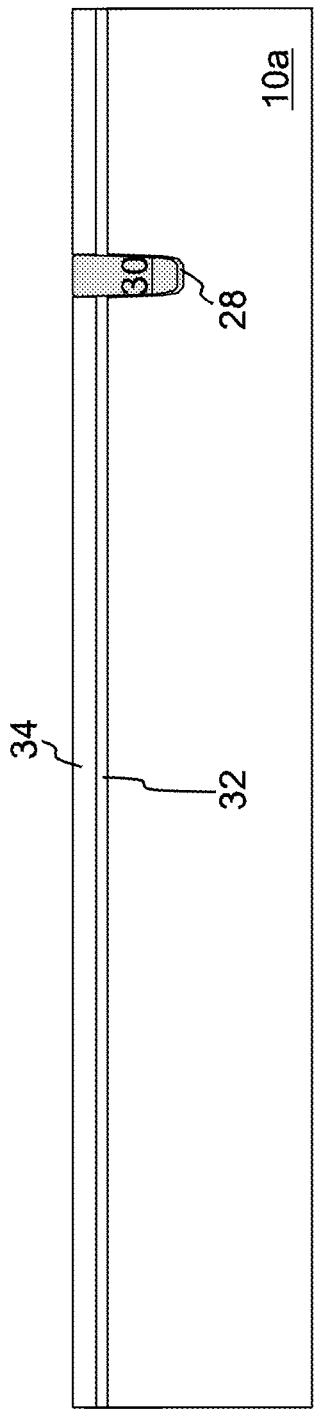
Figure 4C:
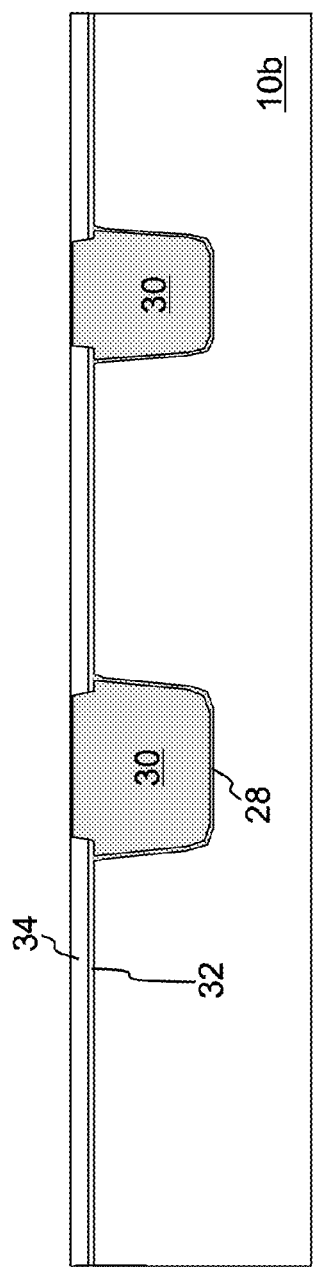
Figure 4D:
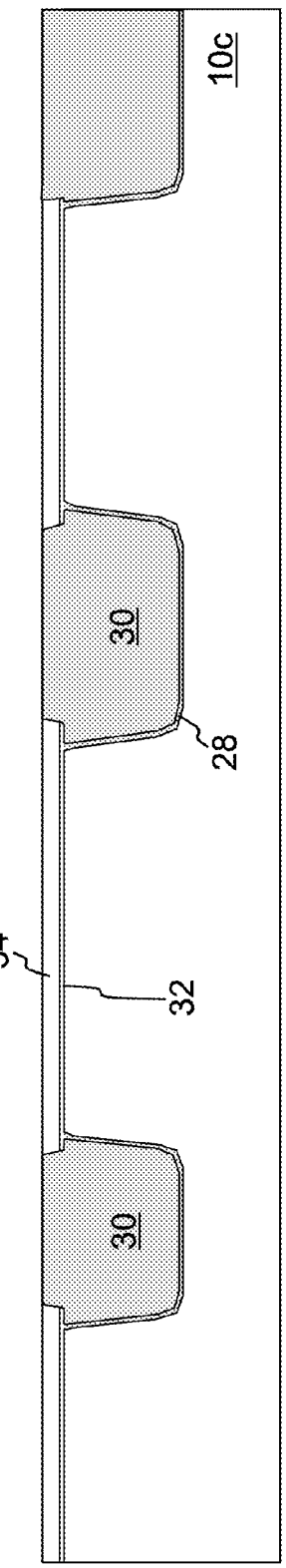
Figure 5A:
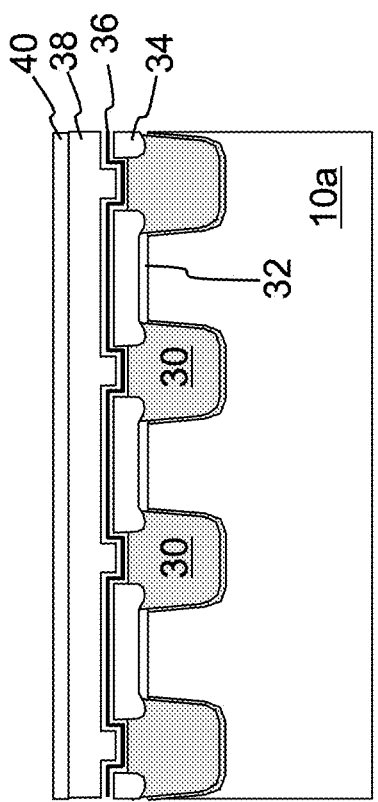
Figure 5B:
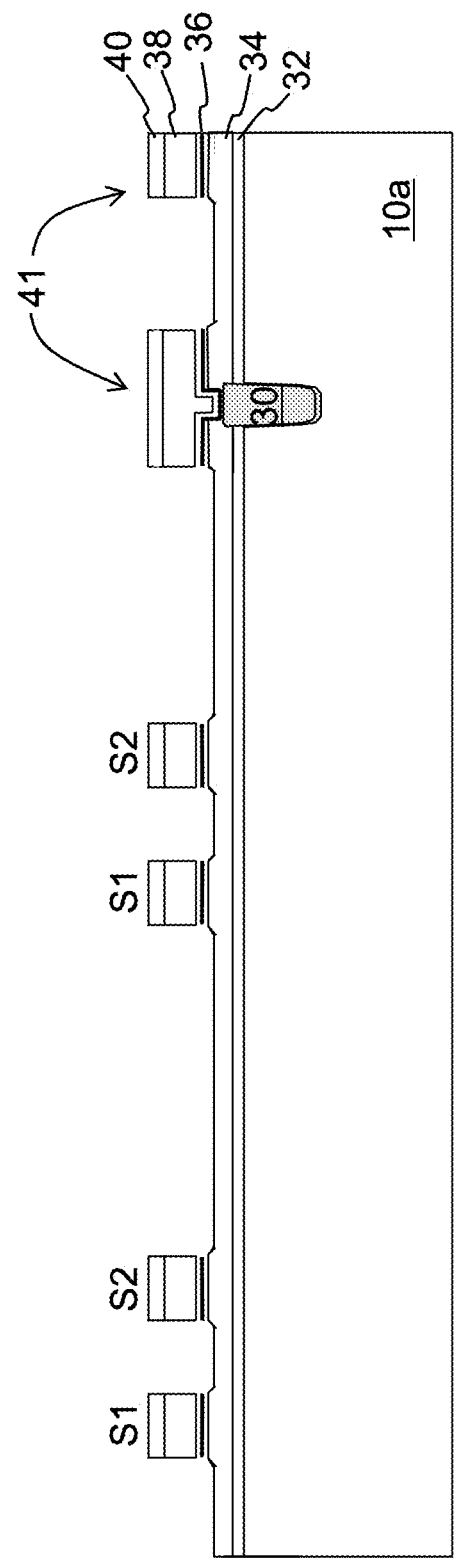
Figure 5C:
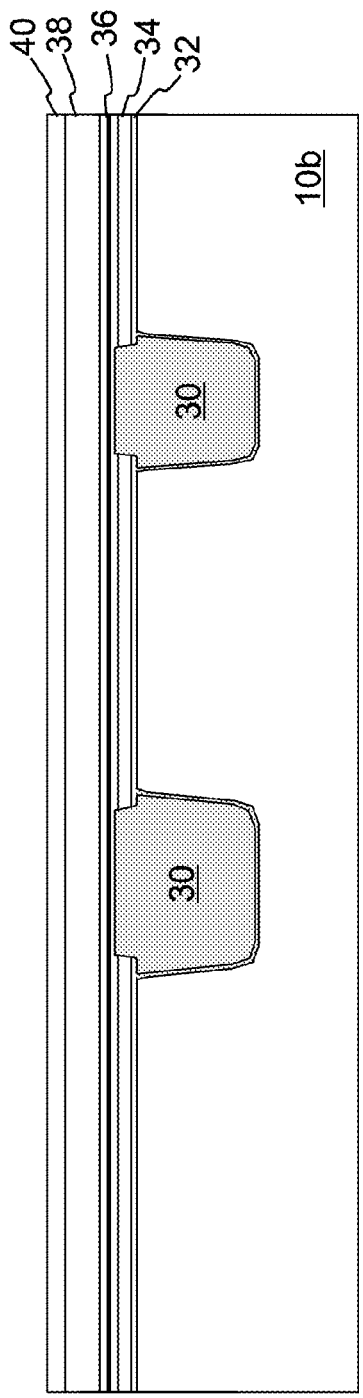
Figure 5D:
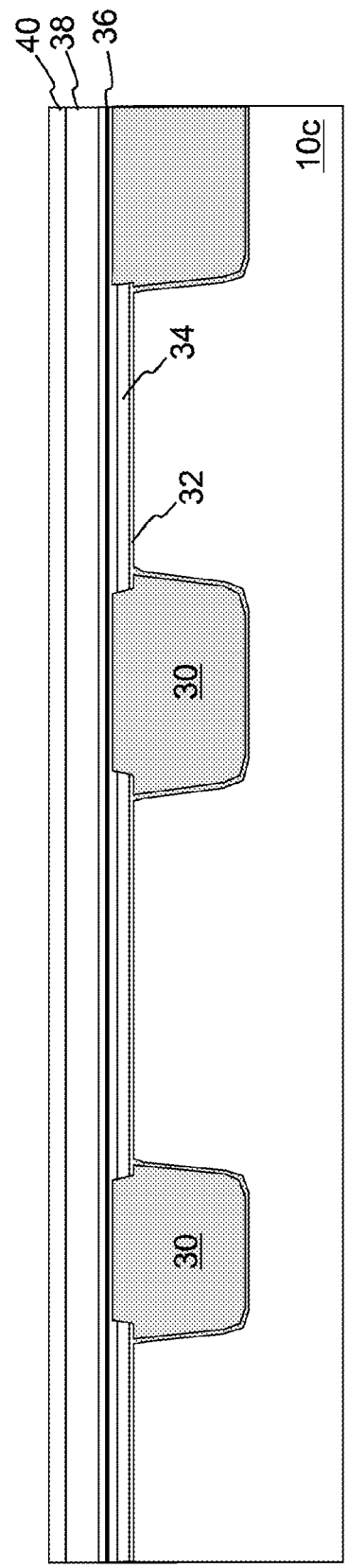
Figure 6A:
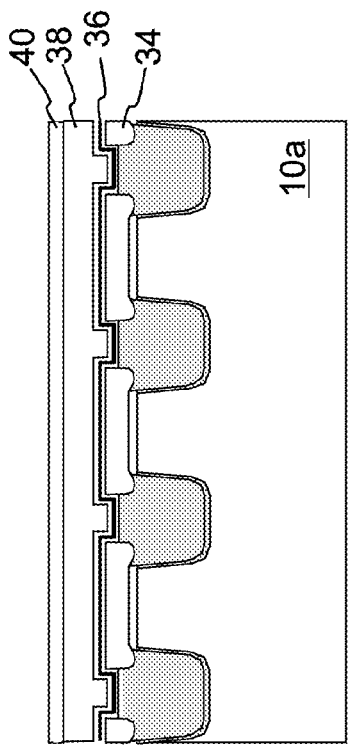
Figure 6B:
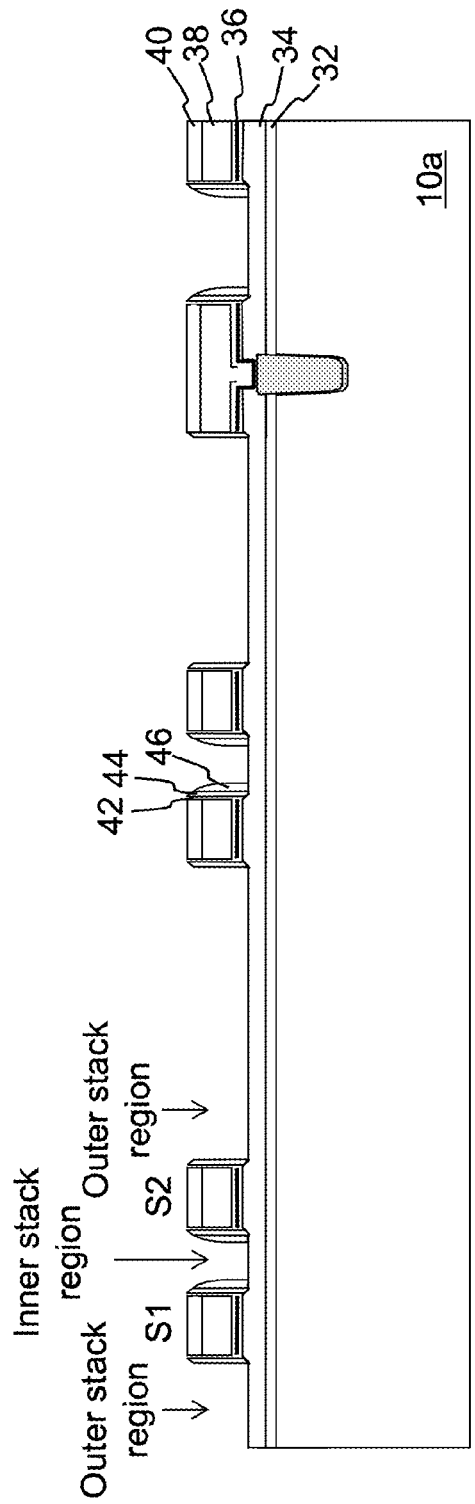
Figure 6C:
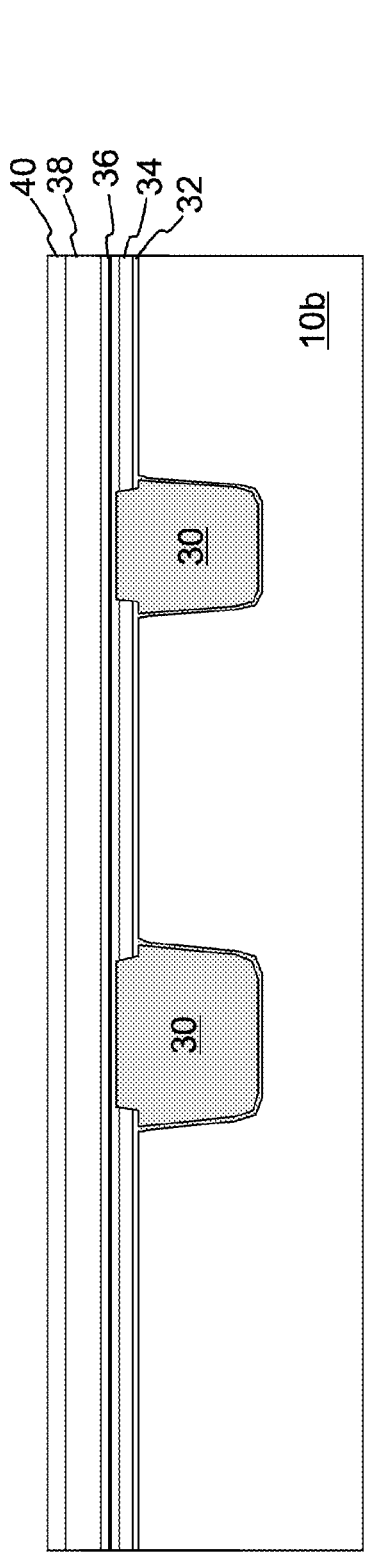
Figure 6D:
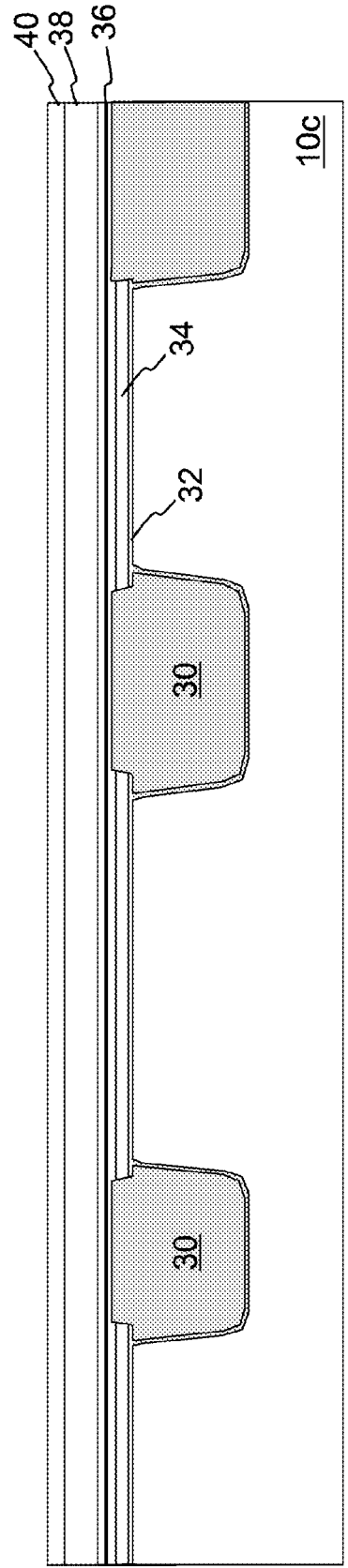

The process begins by forming isolation regions 12 (i.e. STI) in a semiconductor substrate 10 (e.g. a p-type substrate). The isolation regions 12 divide the substrate into three areas as illustrated in FIG. 1: memory array area 14 in which memory cells will be formed, core device area 16 in which core logic devices will be formed, and HV device area 18 in which HV logic devices will be formed. The STI isolation in FIG. 1 is well known in the art and not further described.

The process of forming the memory cells is shown in FIGS. 2A-14A (which include cross sectional views of the memory array area 14 portion of the substrate 10a in the word line (WL) direction) and FIGS. 2B-14B (which include cross sectional views of the memory array area 14 portion of the substrate 10a in the bit line (BL) direction which is orthogonal to the WL direction). The process of forming the core devices is shown in FIGS. 2C-14C (which include cross sectional views of the core device area 16 portion of the substrate 10b). The process of forming the HV devices is shown in FIGS. 2D-14D (which include cross sectional views of the HV device area 18 portion of the substrate 10c).

An oxide layer 20 is formed on the substrate surface. A nitride layer 22 is formed on the oxide layer 20. A hard mask insulator (HM) such as oxide layer 24 is formed on the nitride layer 22. These three layers are formed in all three substrate areas 10a, 10b and 10c, as shown in FIGS. 2A-2D. A photolithography masking step is performed to selectively form photoresist over certain areas of the substrate 10, and etch the exposed portions using anisotropic oxide, nitride and silicon etches to form trenches 26 that extend through the oxide 24, nitride 22 and oxide 20, and into the silicon substrate 10. These trenches 26 are formed in all three substrate areas 10a-10c. The resulting structures are shown in FIGS. 3A-3D.

A liner layer 28 of oxide is formed along the silicon walls of the trenches 26. Oxide is formed over the structure, followed by an oxide chemical-mechanical polish etch (CMP), which fills the trenches 26 with STI oxide insulation 30. Nitride and oxide etches are used to remove the oxide layers 24 and 20, and nitride layer 22. An oxide layer 32 (FG oxide) is formed on the exposed silicon surface between STI oxide stacks 30. A polysilicon layer 34 (FG poly) is deposited over the structure, followed by a poly implant or by in-situ doped poly, implant anneal, and poly CMP (using STI oxide 30 as polishing stop). STI oxide 30 and FG poly 34 can also be formed using a self-aligned STI process, where the FG poly is defined during the STI etch and conventional lithography is used to define the FG poly. The resulting structure is shown in FIGS. 4A-4D.

A gate insulator 36 is then formed over the structure. Preferably, the insulator 36 is a composite insulator having oxide, nitride, oxide sublayers (ONO). A layer of polysilicon (CG poly) 38 is deposited over the structure. It is preferably subject to implant and anneal, or in-situ doped poly can be used. A hard mask insulator (HM) 40, such as oxide, nitride or a composite of both is formed over the CG poly. A buffer oxide can optionally be added. Up through this step, the oxide 32, poly 34, ONO 36, poly 38 and HM insulator 40 layers have been formed in all three substrate areas 10a-10c. A photolithography masking step is then used to selectively cover portions of the memory array area 14, and all of the core and HV device areas 16/18, with photoresist. A series of oxide, nitride and poly etches are then used to remove the exposed portions of the buffer oxide (if used), HM insulator 40, poly 38, ONO 36 and top portions of the poly 34 in the memory array area 14. This etch leaves pairs of memory stack structures S1 and S2 in the memory array area 14, which will eventually form pairs of memory cells, and additional structure 41 that can be used for control gate and source line strapping. The resulting structure is shown in FIGS. 5A-5D (after photoresist removal). Note that the stack layers 40/38/36/34 remain in the core and HV device areas 16/18.

An oxide deposition is performed to form oxide 42 on the exposed sidewalls of the CG poly 38 in the memory stacks S1 and S2 of the memory array area 14. A nitride deposition and etch are performed to form spacers 44 of nitride along the sides of the memory stacks S1 and S2 of the memory array area 14. An oxide deposition and etch are performed to form spacers 46 of oxide along the nitride spacers 44 on the memory stacks S1 and S2 of memory array area 14. Alternatively, just an oxide or a nitride spacer can be used, or a composite oxide/nitride spacer. A photolithography masking step is performed to cover the inner area of the memory stacks S1 and S2 (i.e. the area between the stacks, herein referred to as the "inner stack region"). An oxide etch is performed to remove the oxide spacers 46 on the outer sides of the memory stacks S1 and S2 (i.e. those areas on the outer portions of each pair of stacks S1 and S2, herein referred to as the "outer stack regions"). The resulting structure is shown in FIGS. 6A-6D (after photoresist removal). These steps are to form the floating gate tip to ease the erase in the cell erase operation. They are optional and can be skipped. Alternately, the floating gate tip can be formed on both edges facing the erase gate and the word line (i.e. on both the inner stack region and the outer stack region).

Figure 7A:
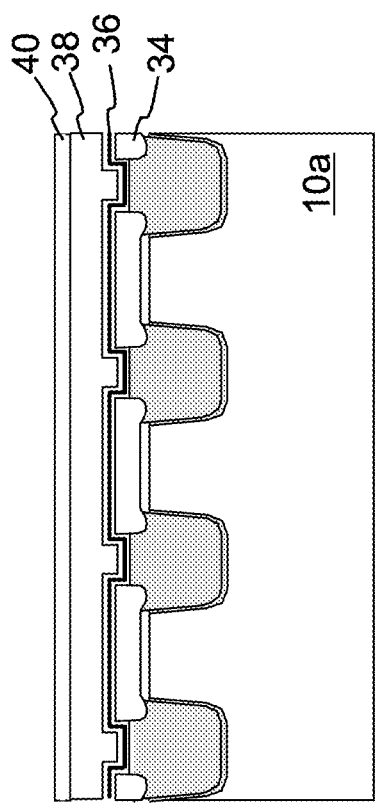
Figure 7B:
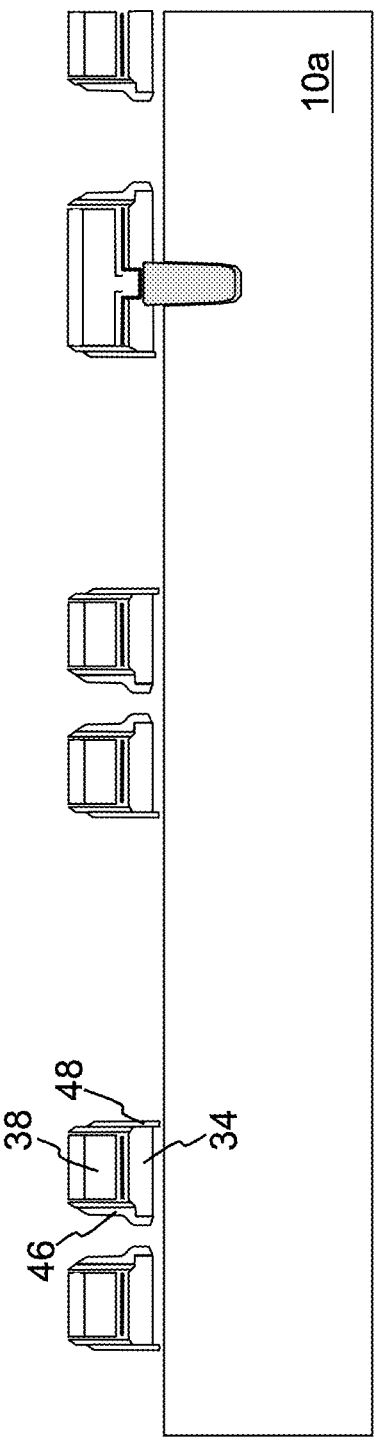
Figures 7C, 7D:
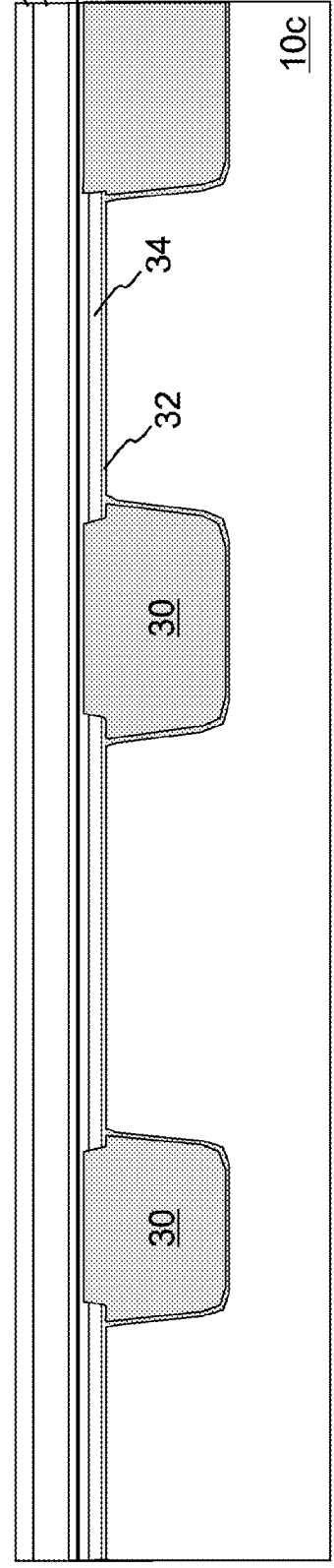
Figure 8A:
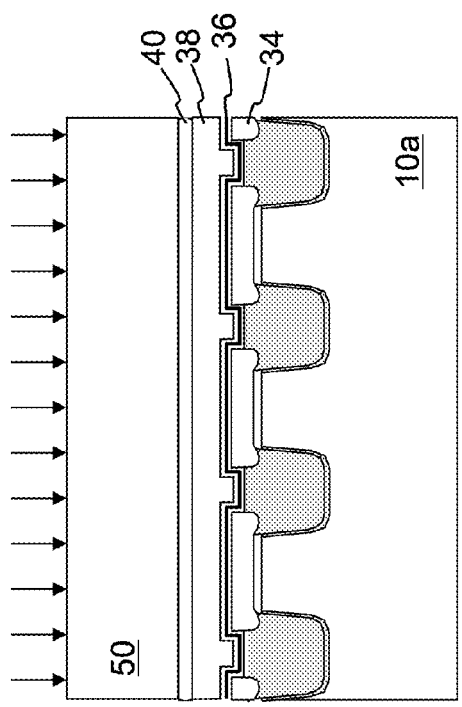
Figure 8B:
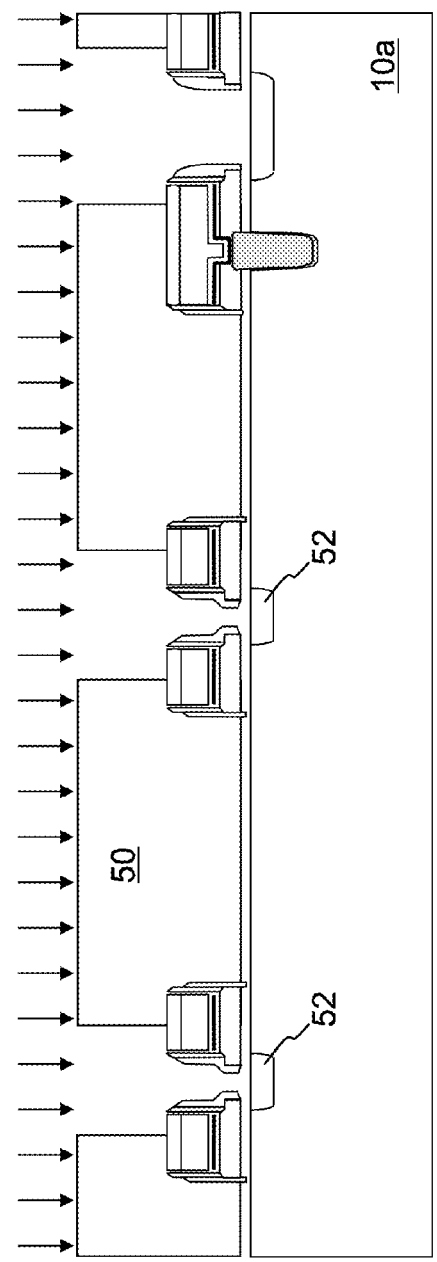
Figure 8C:
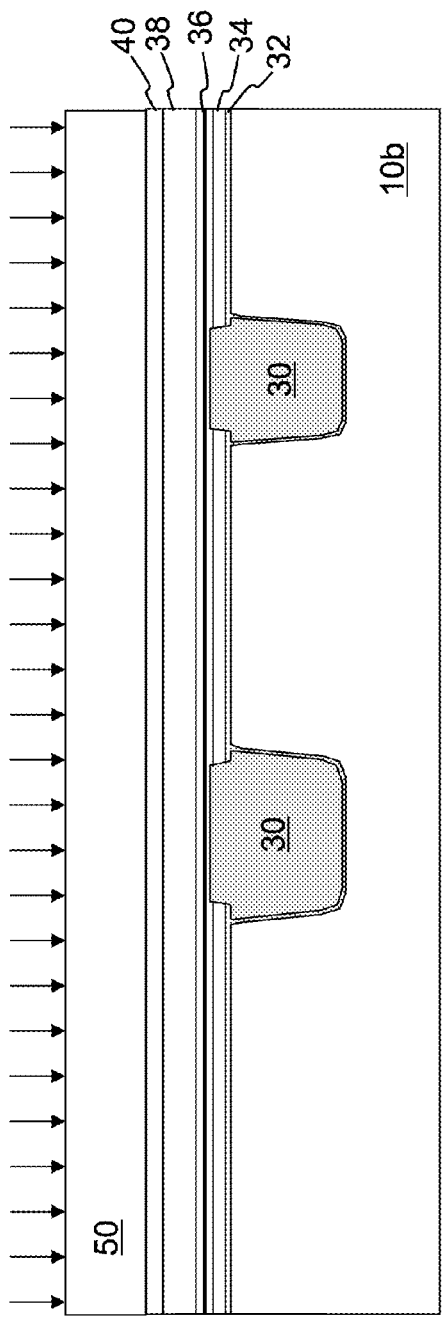
Figure 8D:
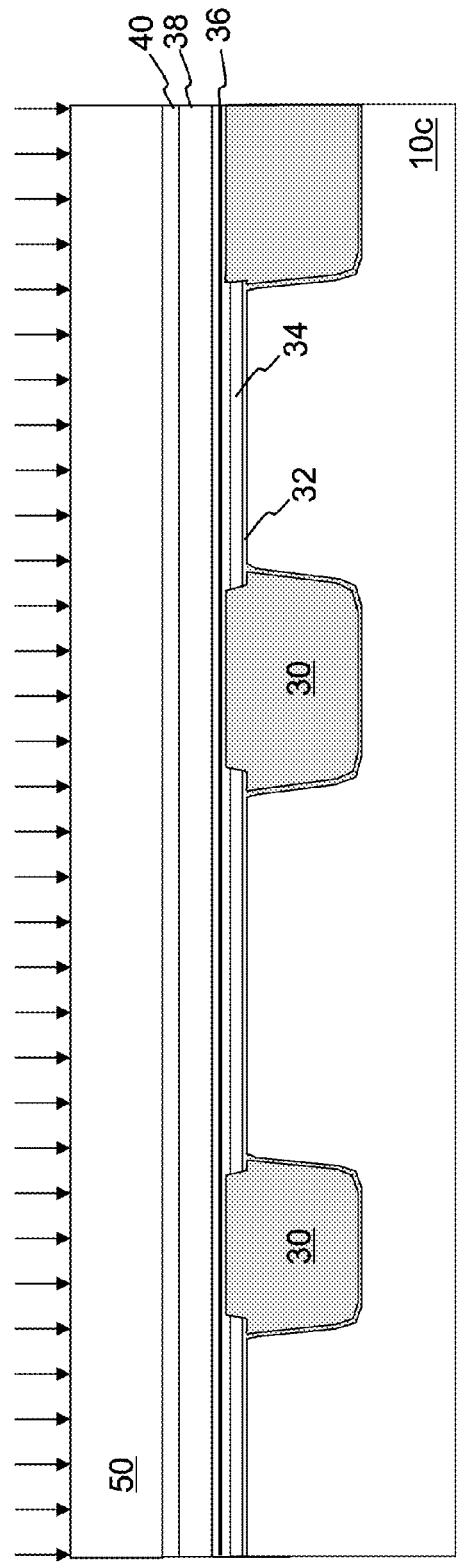
Figure 9A:
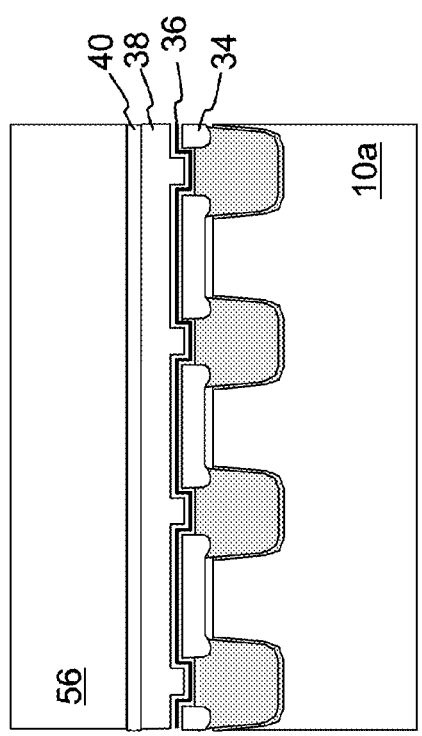
Figure 9B:
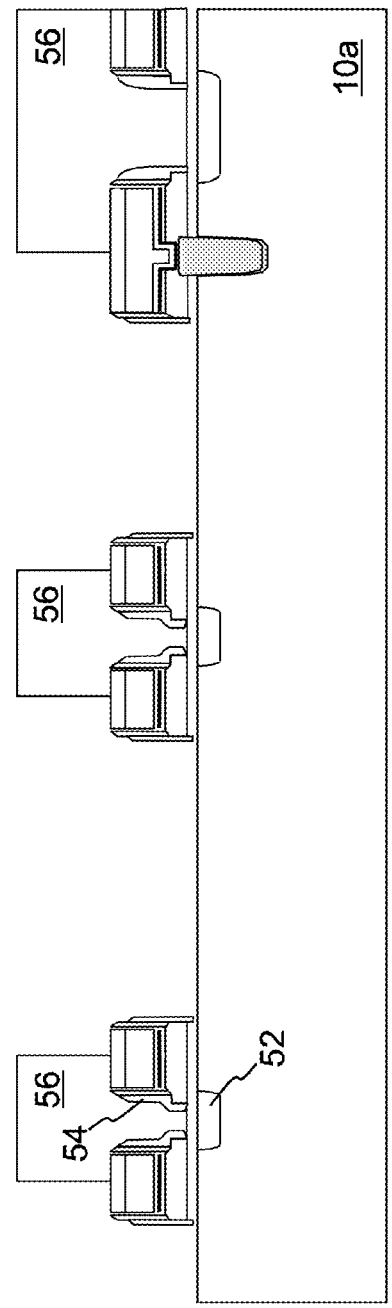
Figure 9C:
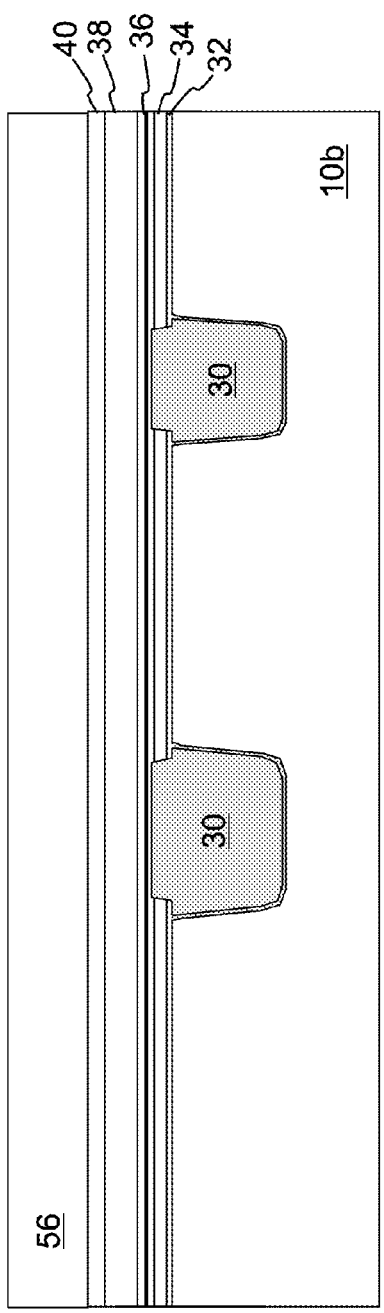
Figure 9D:
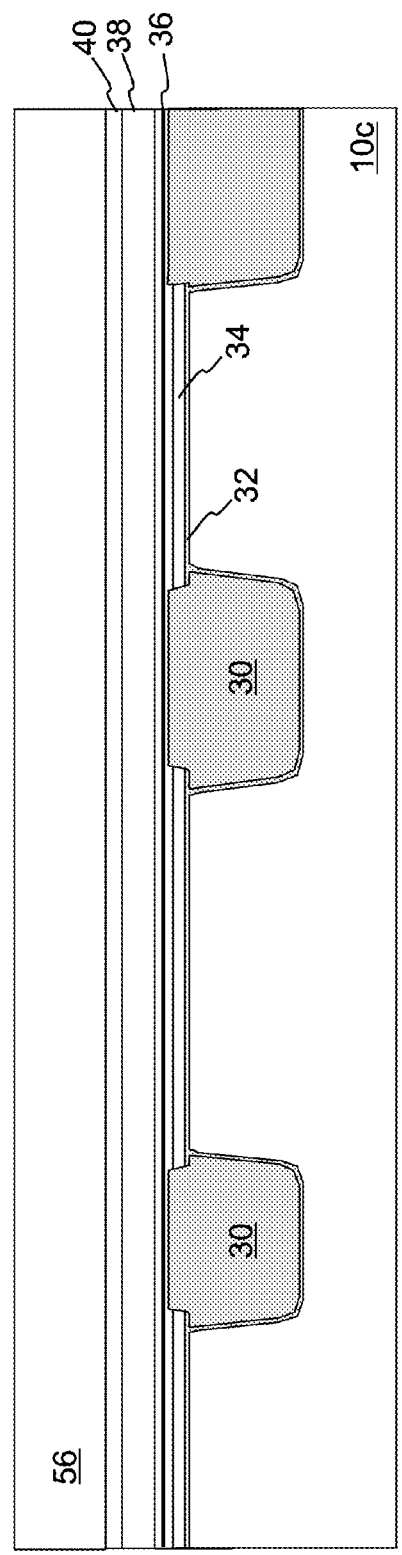
Figure 10A:
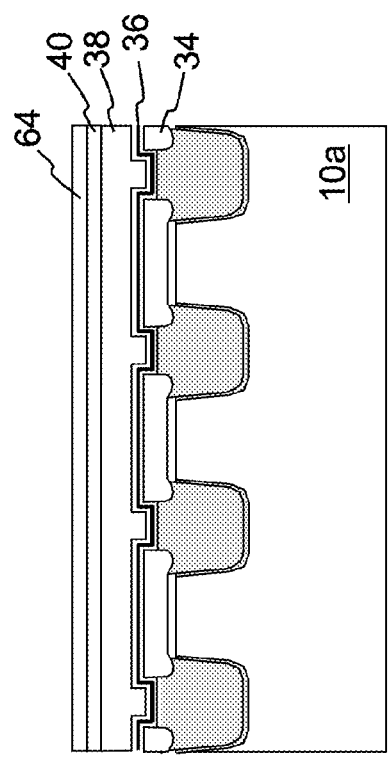
Figure 10B:
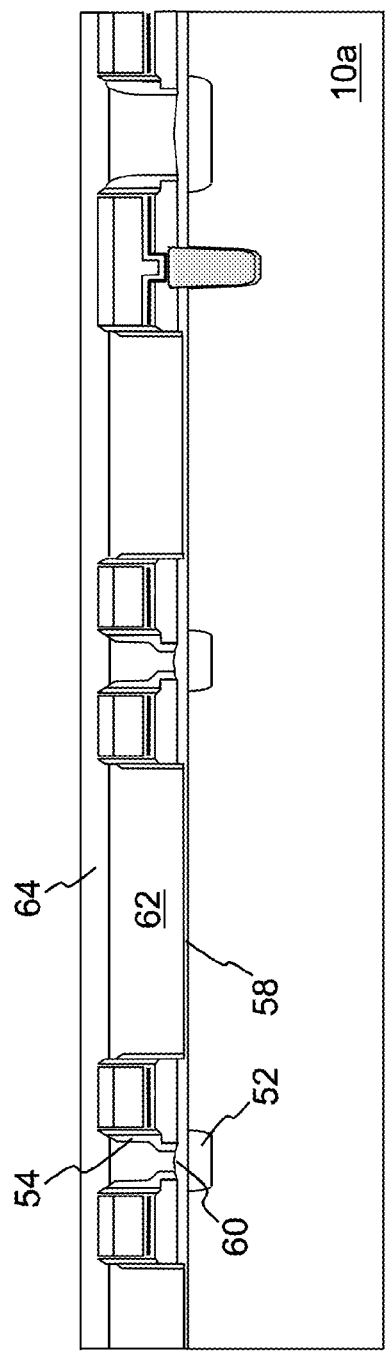
Figure 10C:
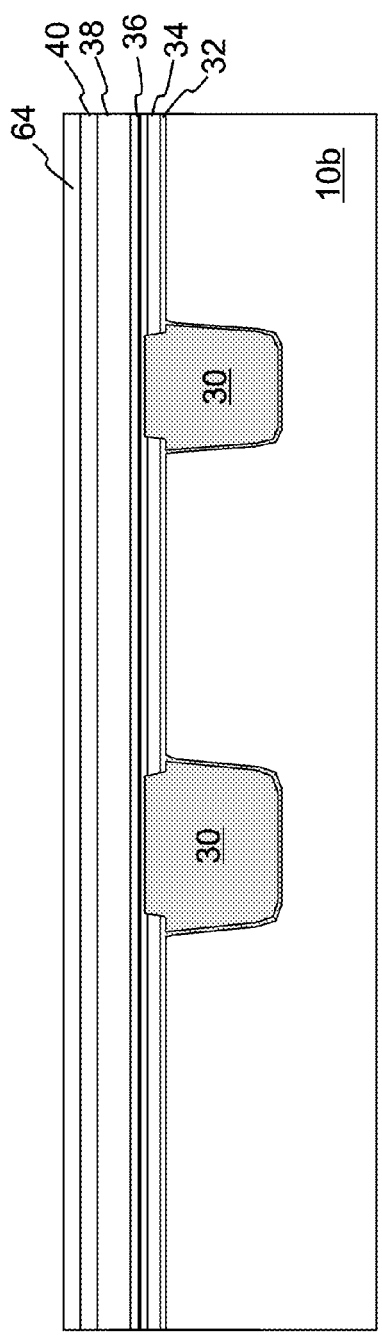
Figure 10D:
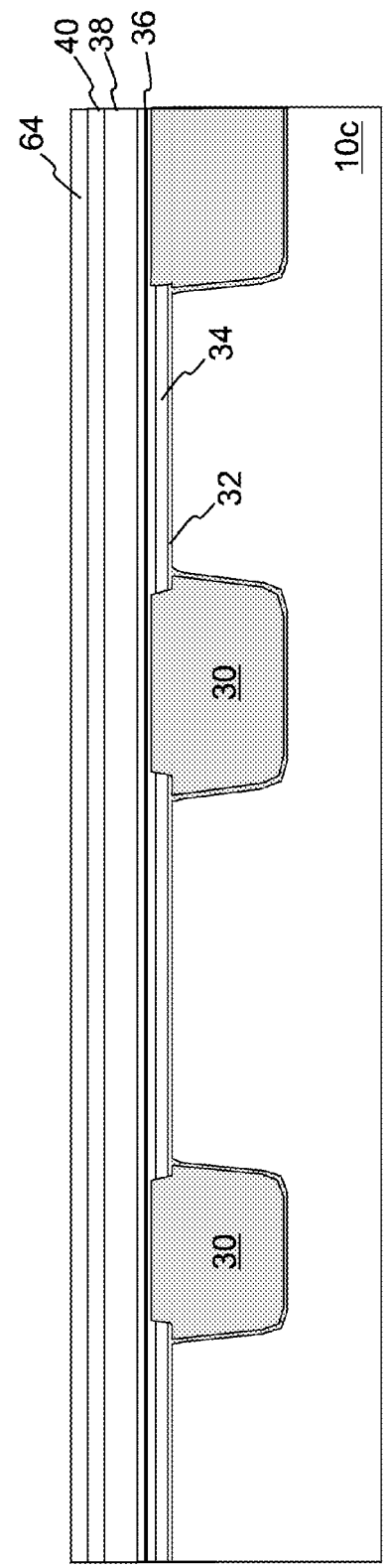
Figure 11A:
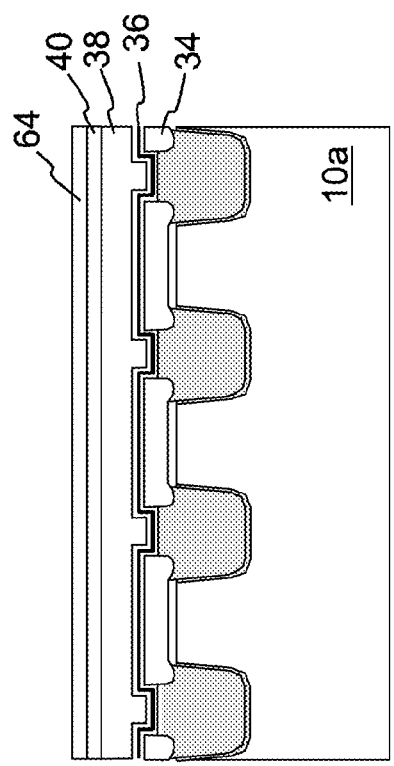
Figure 11B:
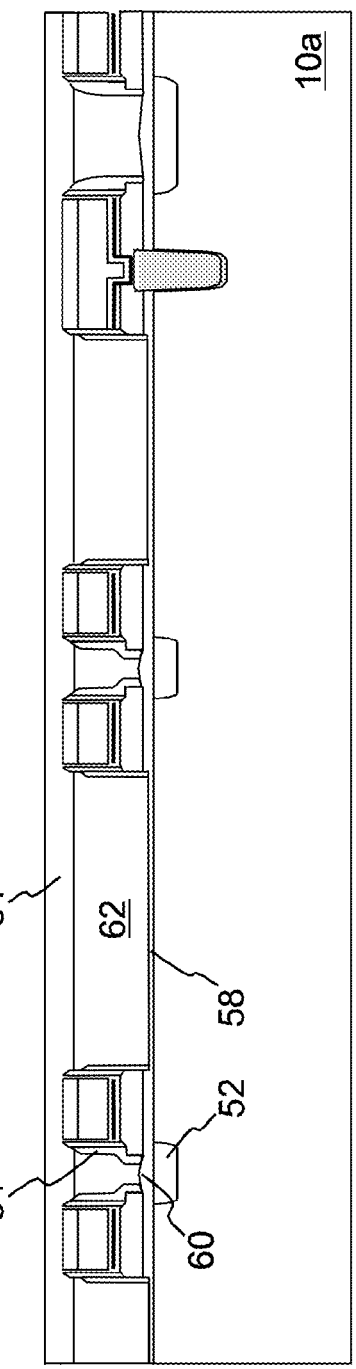
Figure 11C:
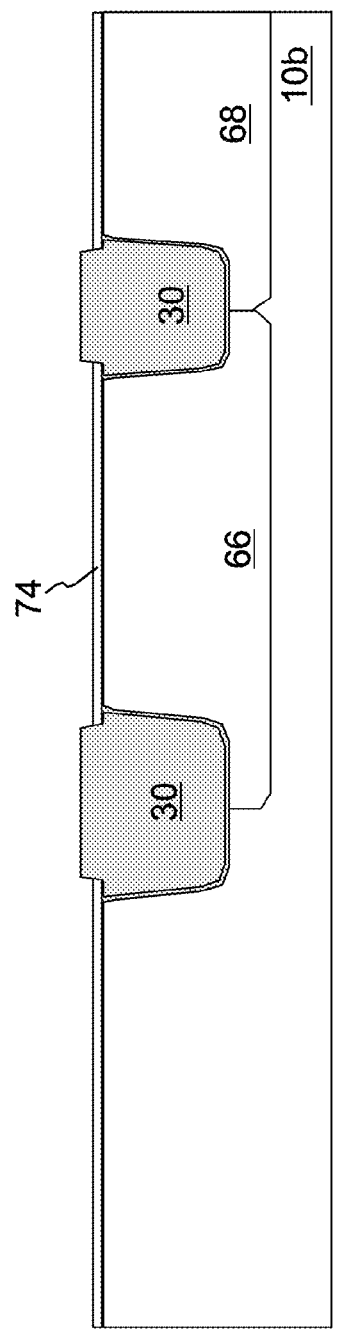
Figure 11D:
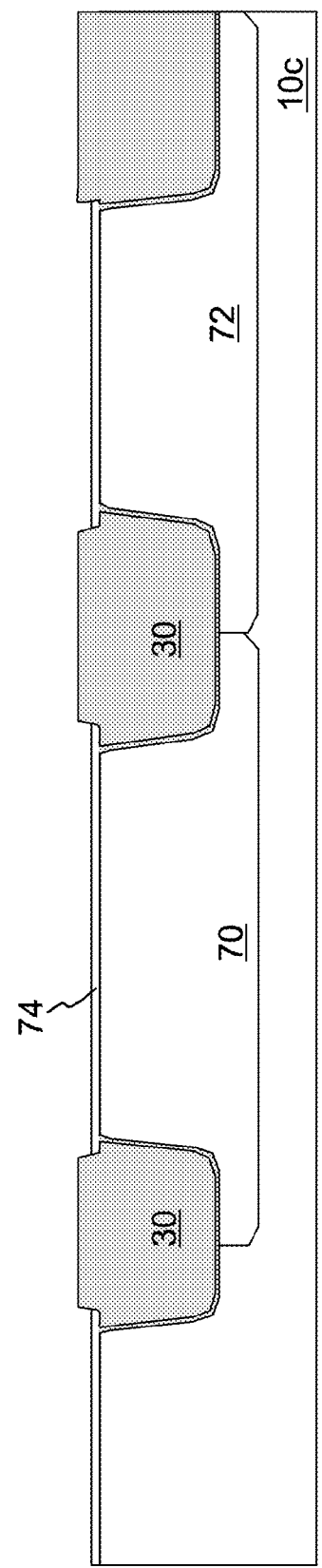
Figure 12A:
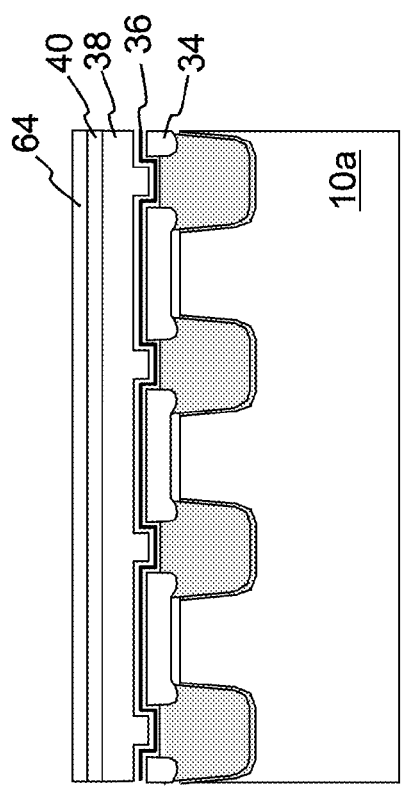
Figure 12B:
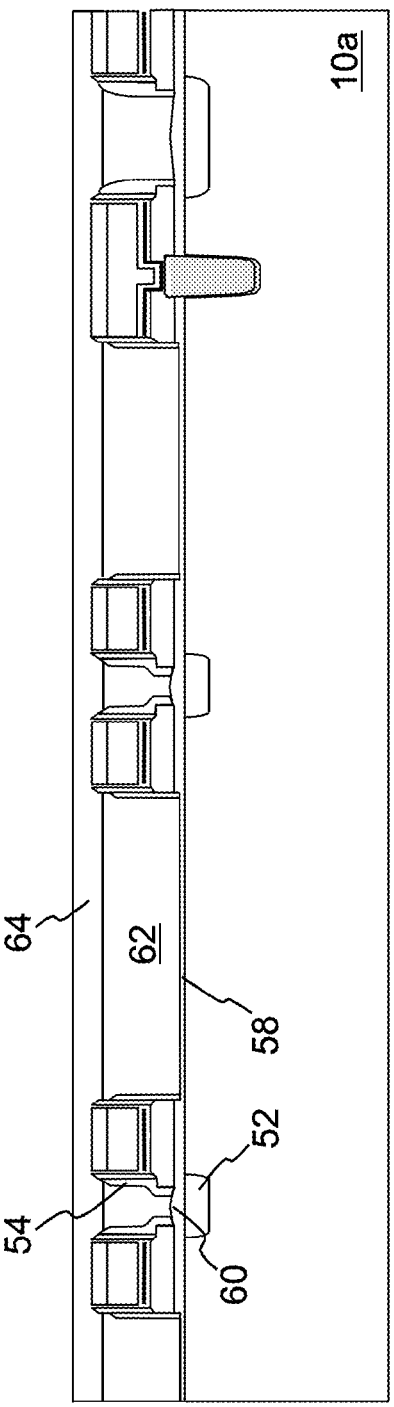
Figure 12C:
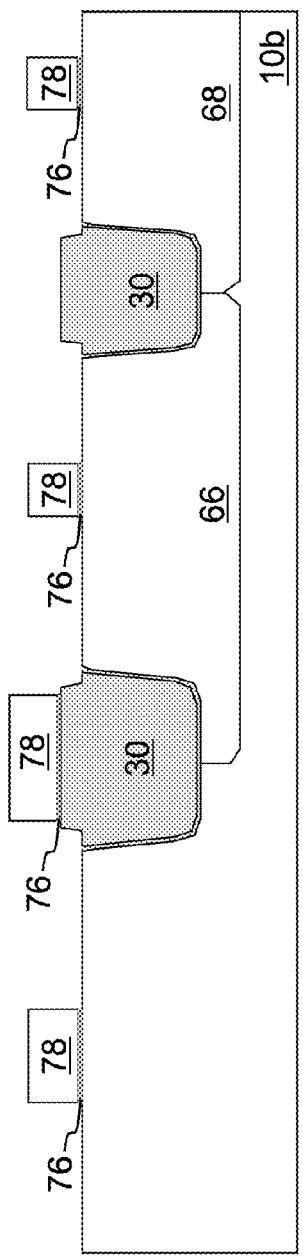
Figure 12D:
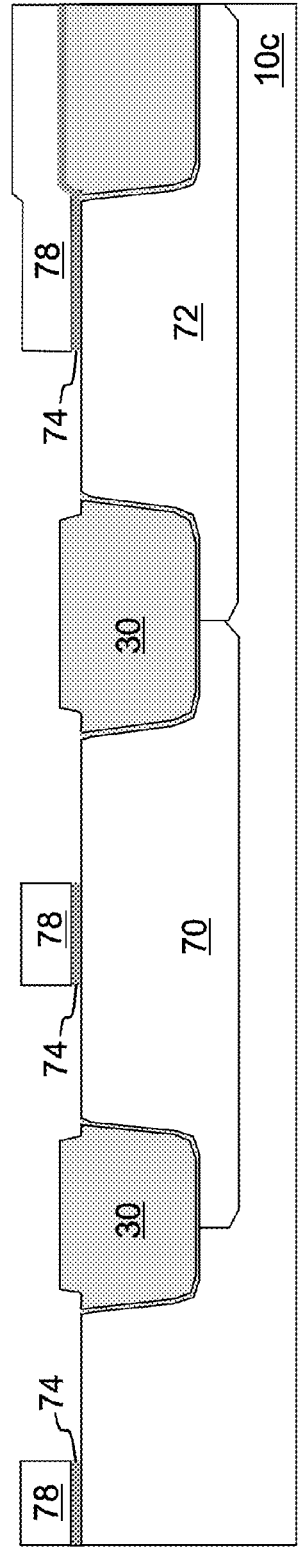
Figure 13A:
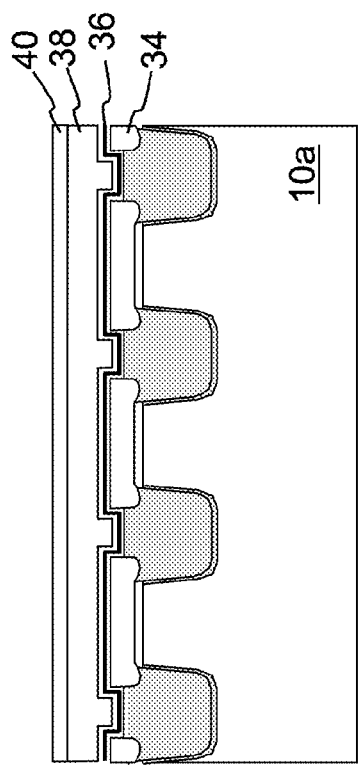
Figure 13B:
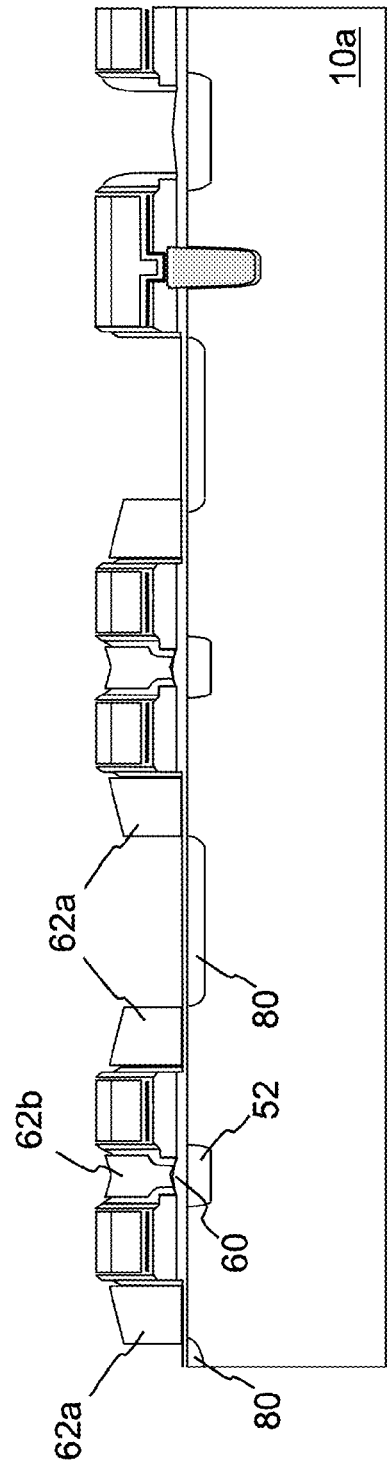
Figure 13C:
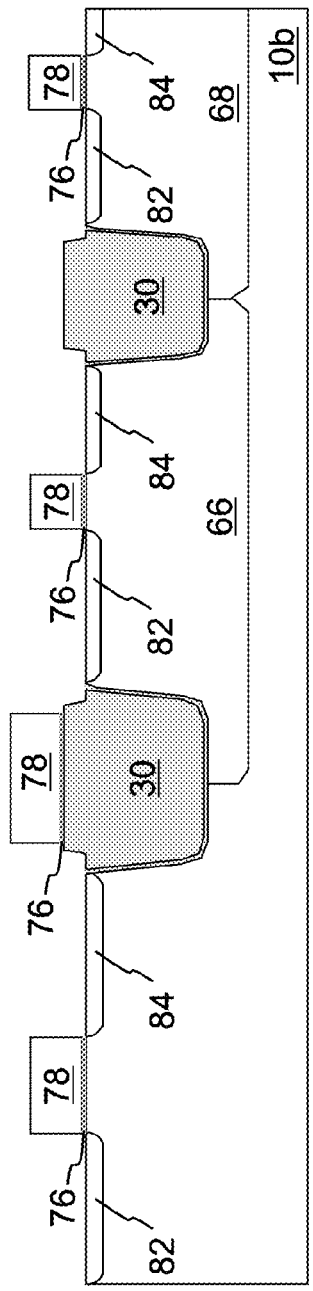
Figure 13D:
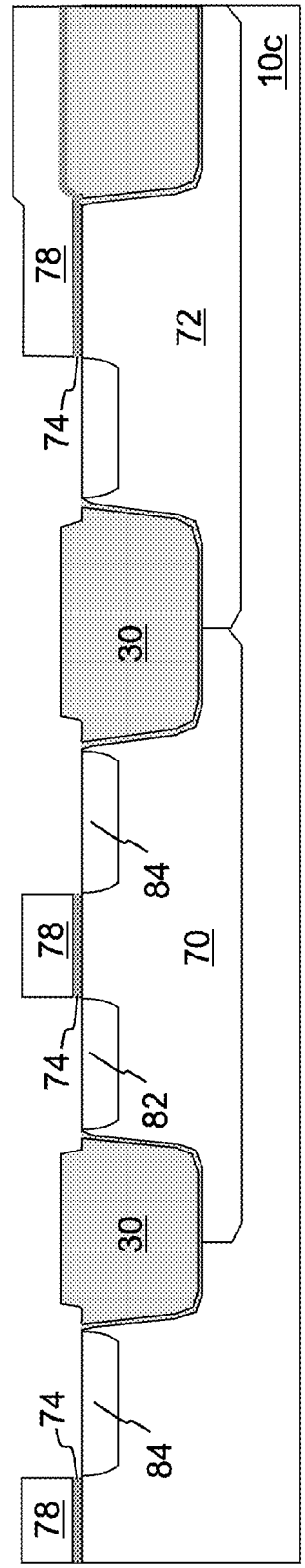
Figure 14A:
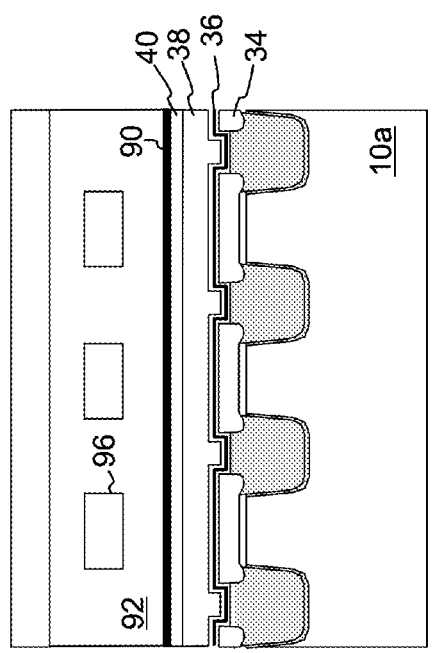
Figure 14B:
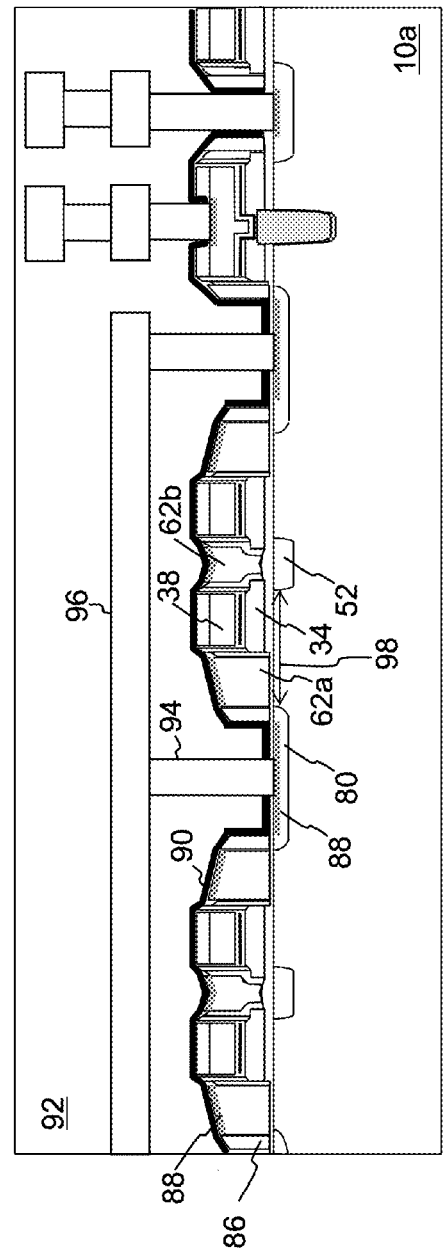
Figure 14C:
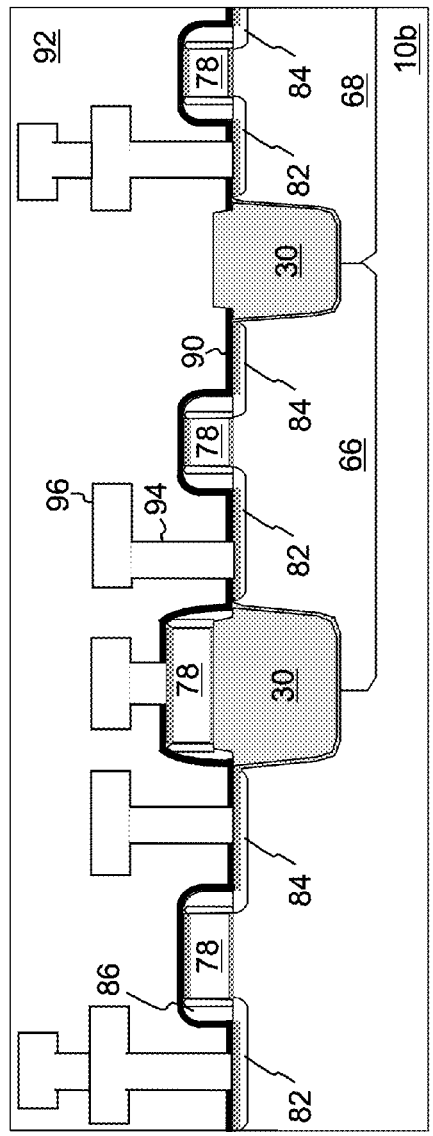
Figure 14D:
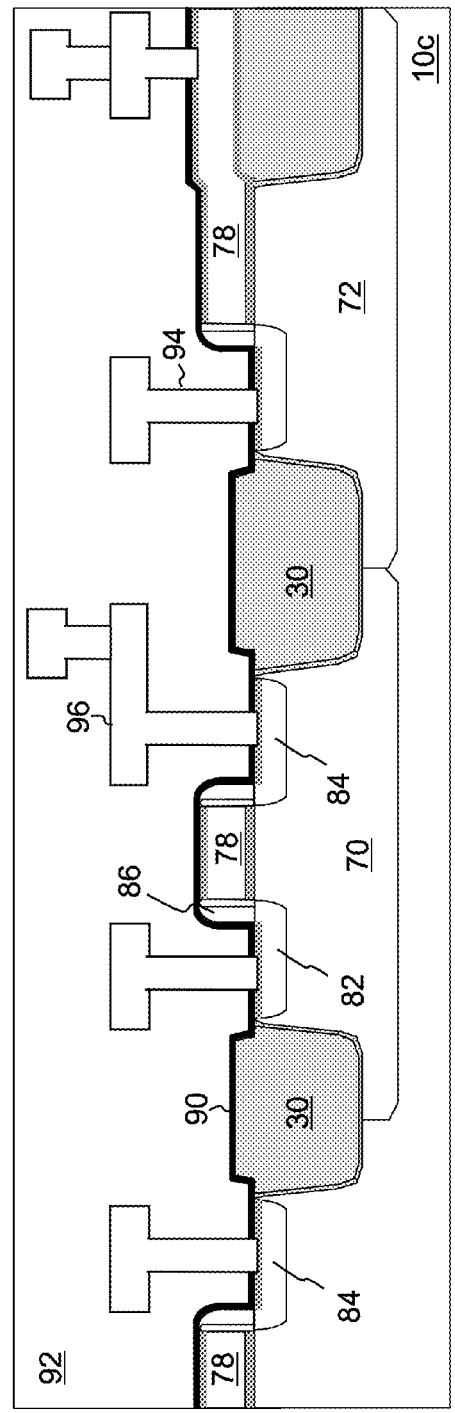
Figure 15A:
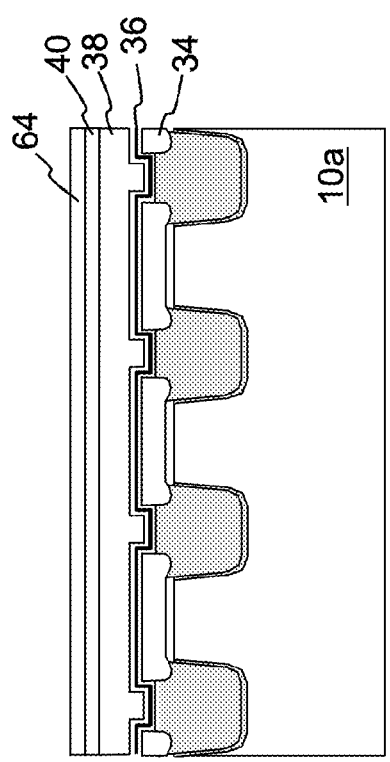
Figure 15B:
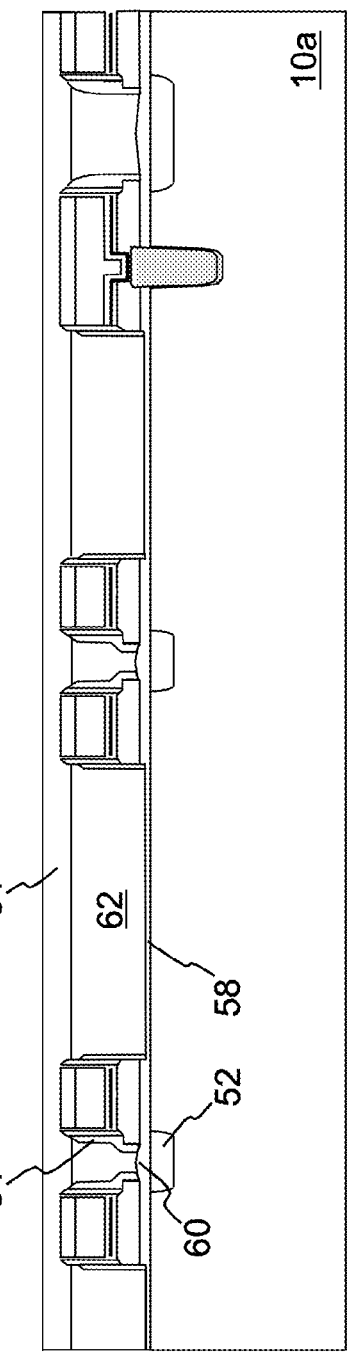
Figure 15C:
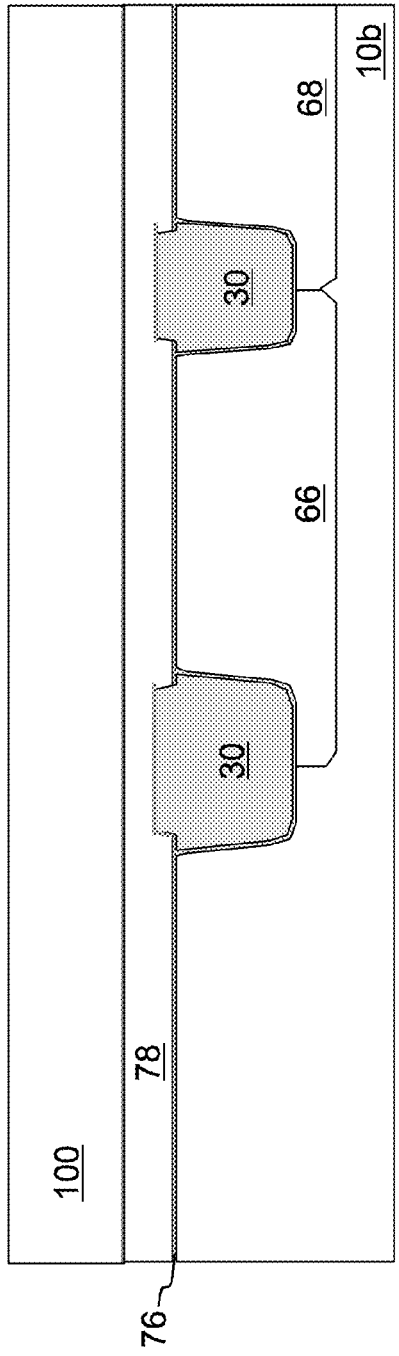
Figure 15D:
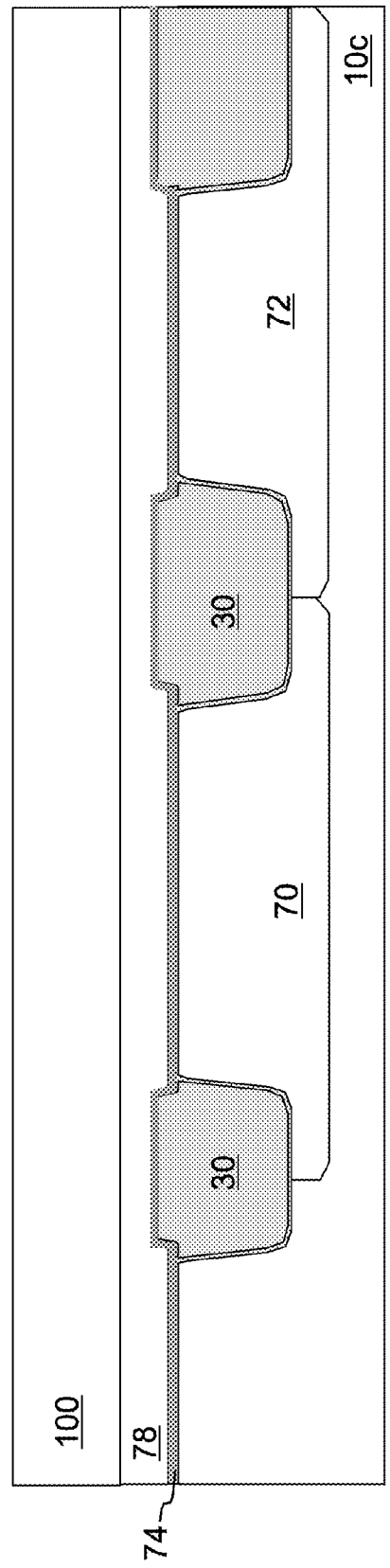
Figure 16A:
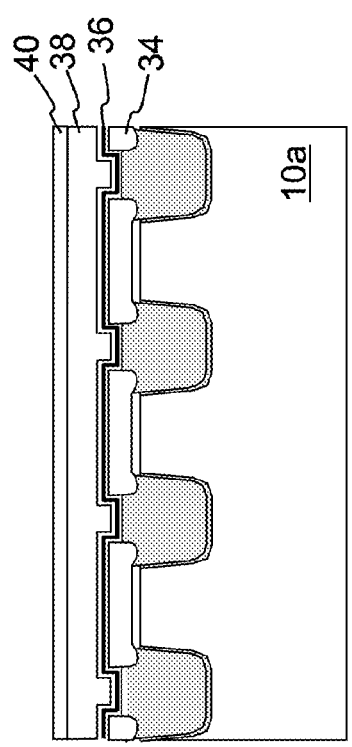
Figure 16B:
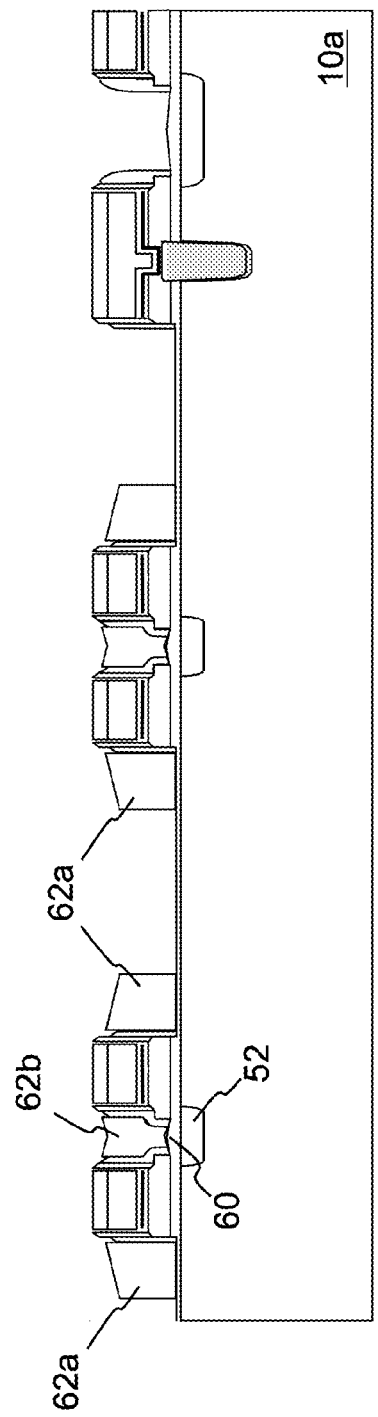
Figure 16C:
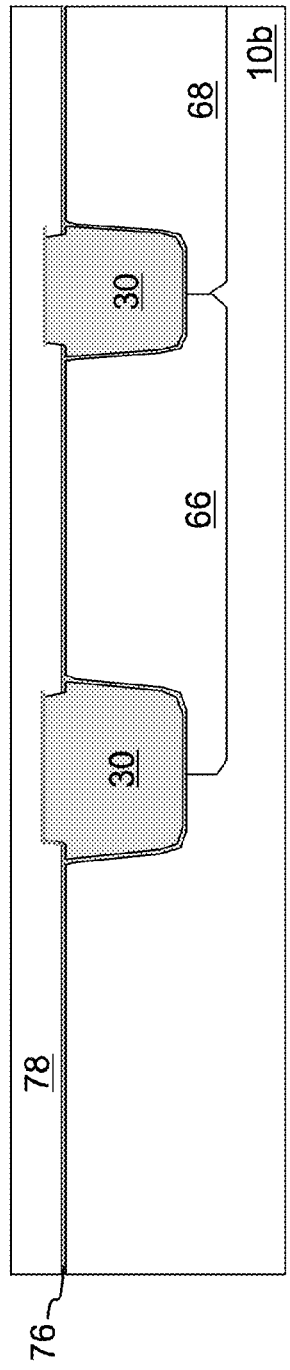
Figure 16D:
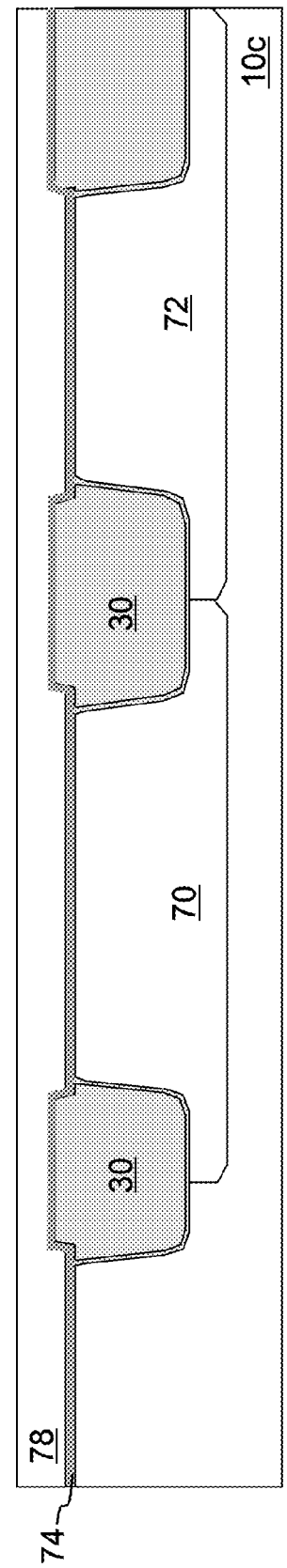
Figure 17A:
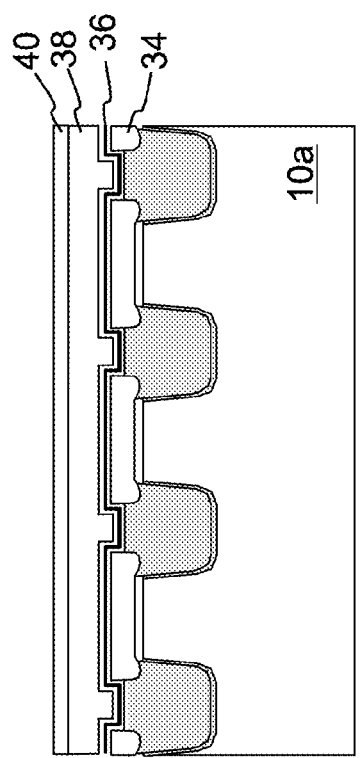
Figure 17B:
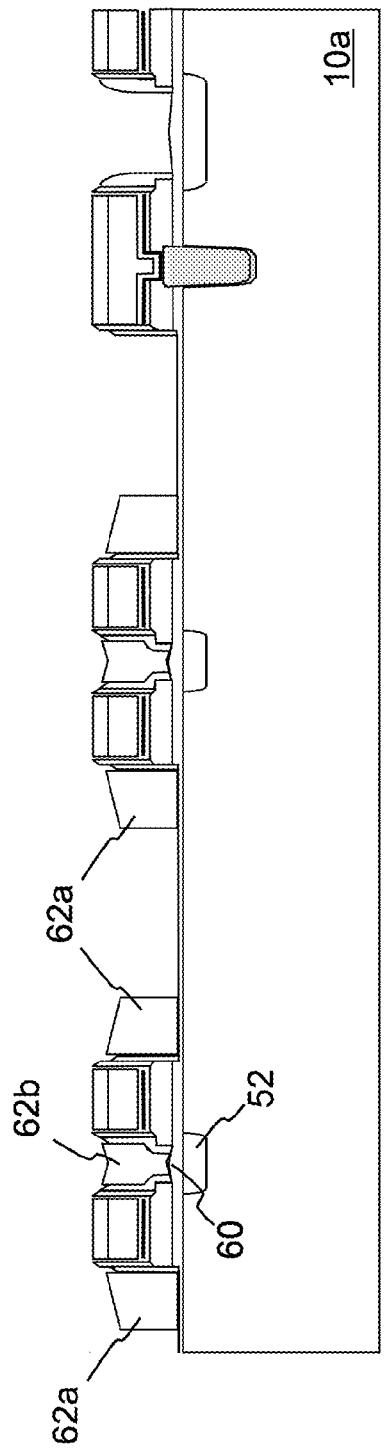
Figure 17C:
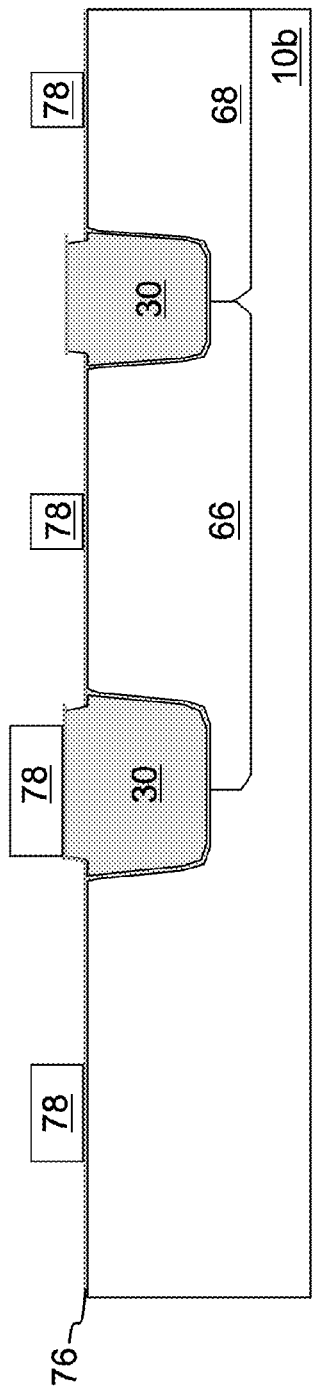
Figure 17D:
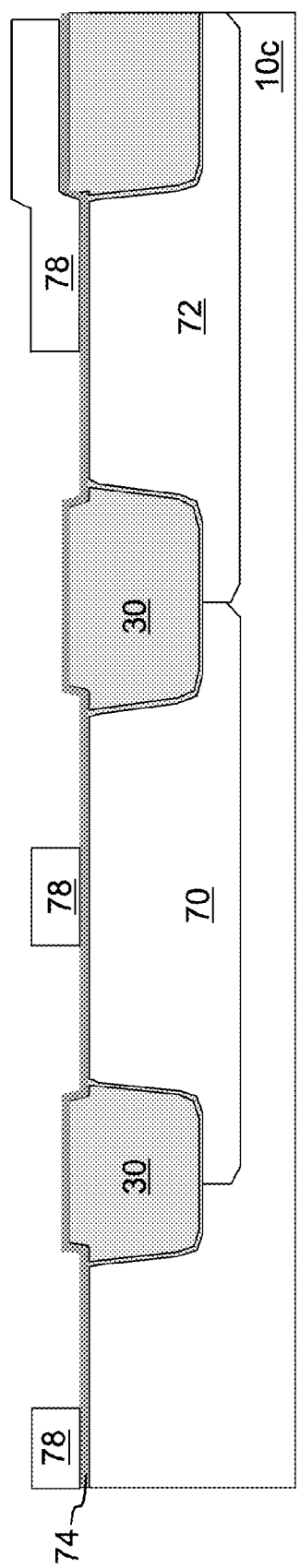

An anisotropic poly etch is performed to remove the exposed portions of the FG poly layer 34 in both the inner and outer stack regions in the memory array area 14, leaving poly blocks 34 under the control gate poly blocks 38, which will be the floating gates and control gates of the memory devices, respectively. Oxide spacers 48 are then formed in the outer stack regions, and oxide spacers 46 are enhanced in the inner stack regions (e.g. by high temperature chemical vapor oxide deposition—HTO and oxide etch). The resulting structure is shown in FIGS. 7A and 7B (the core and HV areas are left unchanged as shown in FIGS. 7C and 7D).

A masking step is performed to form photoresist 50 on the outer stack regions of the memory array area 14, and on the core and HV areas 16/18 (leaving the inner stack regions of the memory array area 14 exposed). An implantation step is then performed to form source regions 52 in the exposed substrate underneath the inner stack regions, with the photoresist 50 protecting the remaining structure, as shown in FIGS. 8A-8D. A wet oxide etch is then used to remove the oxide spacers 46 in the inner stack regions. After the photoresist 50 is removed, a tunnel oxide deposition is used to form a layer of oxide 54 on the structure. A masking step is performed to form photoresist 56 on the structure except the outer stack regions. An oxide etch is then performed to remove the exposed oxide 54 in the outer stack regions. The resulting structure is shown in FIGS. 9A-9D.

The photoresist 56 is then removed. An oxidation step is then performed to form the WL oxide 58 on the substrate surface in the outer stack regions and the source oxide 60 on the substrate surface in the inner stack regions. A layer of polysilicon 62 (WL Poly) is deposited over the structure. A poly CMP etch is performed, using the HM layer as an etch stop, and further poly etch is used to etch down the tops of WL poly 62 if needed, removing the poly layer from the core and HV device areas 16/18 and leaving WL poly 62 only in the inner and outer stack regions of the memory array area 14. A buffer insulation layer 64 is deposited over the structure, as shown in FIGS. 10A-10D. This layer 64 is formed to protect the memory array during core and HV processing steps. The layer 64 can be oxide or nitride alone, or a combination of such insulation films. Up until this point, the HM layer 40 (and underlying CG poly 38, ONO layer 36, etc.) in the core and HV device areas 16/18 have protected those areas from the foregoing memory cell processing steps. The buffer layer 64 will now protect the memory array area 14 from the initial logic device processing steps that follow.

A photolithographic process is used to cover the memory array area 14 with photoresist, but leave the core and HV device areas 16/18 exposed. A series of nitride, oxide and poly etches are then performed to remove all the nitride, oxide and poly layers from the core and HV device areas 16/18, leaving the bare substrate surface and the STI insulation regions 30. After photoresist removal, a series of masking steps and implant steps are performed to form P wells 66 and N wells 68 in the substrate 10 in the core device area 16, and HP wells 70 and HN wells 72 in the substrate 10 in the HV device area 18. An oxidation step is then used to form an HV oxide layer 74 on the exposed silicon substrate surface in the core and HV device areas 16/18. The resulting structure is illustrated in FIGS. 11A-11D.

A photolithographic process is used to cover the HV device area 18 and memory array area 14 with photoresist, but leave the core device area 16 exposed. An oxide etch is used to remove the HV oxide layer 74 from the core device area 16. After photoresist removal, a core gate oxidation is used to form an oxide layer 76 on the substrate in the core device area 16. This results in an oxide layer on the substrate that is thicker in the HV device area 18 than in the core device area 16. A poly layer is then formed over the structure. A photolithography process is used to form photoresist in select regions of the core device and HV device areas 16/18 (the memory array area 14 is left exposed). A poly etch follows leaving poly blocks 78 in the core and HV device areas 16/18. The resulting structure is shown in FIGS. 12A-12D (after photoresist removal).

An oxide etch is used to remove the oxide layer 64 in the memory array area 14. The core and HV device areas 16/18 can be masked with photoresist for this step. Then, a photolithography masking step is performed to cover the structure with photoresist except for select portions of the outer stack regions of the memory array area 14. A poly etch is then used to remove exposed portions of polysilicon 62, leaving WL poly blocks 62a adjacent each stack S1 and S2 (in the outer stack regions) and poly blocks 62b between each stack S1 and S2 (in the inner stack regions). A mask and implantation process is then performed to form drain regions 80 in the memory array area 14 adjacent the poly blocks 62a, and source/drain regions 82/84 in the core and HV areas 16/18 adjacent the poly blocks 78. The resulting structure is illustrated in FIG. 13A-13D (after photoresist removal).

Post end processing is then performed, which includes forming side insulation spacers 86, silicide 88 on exposed polysilicon and substrate surfaces, forming protective insulation layer 90 over the structures, covering the structures with insulation 92, forming holes or trenches through the insulation 92 to expose the memory cell drain regions, as well as the source, drain and gates of the logic devices, and filing the holes or trenches with conductive material (i.e. any appropriate metal) to form vertically extending contacts 94 and horizontally extending contact lines 96. The final structures are shown in FIGS. 14A-14D.

In the memory array area 14, pairs of memory cells are formed, each memory cell including a floating gate 34, word line gate 62a, control gate 38, erase gate 62b, source 52, drain 80, with a channel region 98 extending between the source 52 and drain 80, where a first portion of the channel region 98 is controlled by floating gate 34 and a second portion of the channel region 98 is controlled by the word line gate 62a. In the core and HV device areas 16/18, logic devices each include a gate 78, source 82 and drain 84. The logic devices in the HV device area 18 can operate at a higher voltage because of the thicker oxide layer 74 underneath the gate 78 compared to that in the core device area 16, and the deeper source/drain junctions 82/84.

FIGS. 15-17 illustrate an alternate embodiment, which starts with the structures in FIGS. 11A-11D. After the formation of the poly layer in the core and HV device areas 16/18 but before the selective removal thereof to form gates 78, the core and HV device areas 16/18 are covered with photoresist 100, leaving the memory array area 14 exposed, as shown in FIGS. 15A-15D. An oxide etch is then performed to remove the oxide 64 from the memory array area 14. After the photoresist 100 is removed, another masking step is performed to cover the structures with photoresist except areas between stack pairs in the memory array area 14. A poly etch is then used to remove portions of the poly layer between stack pairs in the memory array area to result in WL gates 62a, as shown in FIGS. 16A-16D (after photoresist removal). Then a logic poly mask step is performed to cover the structures except certain portions of the core and HV device areas 16/18, wherein a poly etch is then performed to form the gates 78 in the core and HV device areas 16/18, as shown in FIGS. 17A-17D. An implant (to form the source/drain regions of the core and HV device areas and the drain regions in the memory array area) and post end processing (to form the electrical contacts) are then performed as described above. This alternative process minimizes exposure and protects the logic gates during the WL gate forming process by swapping logic gate and WL gate formation. This alternative process is also beneficial should the logic device processing be further modified to include SiGe, and/or to include HKMG materials (i.e. a high-K insulation material under a metal) as part of or all of the logic gates and underlying insulation.

It is to be understood that the present invention is not limited to the embodiment(s) described above and illustrated herein. For example, references to the present invention herein are not intended to limit the scope of any claim or claim term, but instead merely make reference to one or more features that may be covered by one or more eventual claims. Materials, processes and numerical examples described above are exemplary only, and should not be deemed to limit the claims. For example, the logic gate insulation layers 74/76 could either or both be formed of a high K material HK (i.e. having a dielectric constant K greater than that of oxide, such as $HfO_2$, $ZrO_2$, $TiO_2$, $Ta_2O_5$, or other adequate materials, etc.). Any of the polysilicon layers and elements (e.g. logic gates 78, word line gates 62a, erase gates 62b, etc.) could be formed of any appropriate conductive materials instead of polysilicon, such as metal MG. Further, not all method steps need be performed in the exact order illustrated or claimed, but rather in any order that allows the proper formation of the memory cells and logic devices as described herein. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a memory device, comprising:
   providing a semiconductor substrate having a memory array area, a core device area and an HV device area;
   forming a first conductive layer over and insulated from the substrate in the memory array, core device, and HV device areas;
   forming a second conductive layer over and insulated from the first conductive layer in the memory array, core device, and HV device areas;
   forming a first insulation layer over the second conductive layer in the memory array, core device, and HV device areas;
   etching through portions of the first insulation layer and the first and second conductive layers in the memory array area to form pairs of stacks, wherein each of the stacks includes a block of the second conductive layer over and insulated from a block of the first conductive layer;
   forming source regions in the substrate, wherein each of the source regions is disposed between the stacks of one of the pairs of stacks;
   forming a third conductive layer in the memory array, core device and HV device areas;
   removing the third conductive layer from the core device and HV device areas;
   forming a second insulation layer over the third conductive layer in the memory array area and over the first insulation layer in the core device and HV device areas;
   removing the first and second insulation layers, and the first and second conductive layers, from the core device and HV device areas;
   forming conductive gates disposed over and insulated from the substrate in the core device and HV device areas;
   removing the second insulation layer in the memory array area;
   removing portions of the third conductive layer to form blocks of the third conductive layer adjacent to and insulated from the pairs of stacks;
   forming drain regions in the substrate adjacent the blocks of the third conductive layer in the memory array area; and
   forming second source and second drain regions in the substrate adjacent the conductive gates in the core device and HV device areas.

2. The method of claim 1, wherein the first insulation layer is oxide, nitride or a composite of oxide and nitride.

3. The method of claim 1, wherein the second insulation layer is oxide, nitride or a composite of oxide and nitride.

4. The method of claim 1, wherein the first, second and third conductive layers are polysilicon.

5. The method of claim 1, wherein the conductive gates are polysilicon.

6. The method of claim 1, wherein the conductive gates are metal.

7. The method of claim 6, wherein the conductive gates are insulated from the substrate by a high K material.

8. The method of claim 1, wherein the removing the third conductive layer from the core device and HV device areas further comprises:
   removing a top portion of the third conductive layer from the memory array area, resulting in a plurality of blocks of the third conductive layer each disposed between the stacks of one of the pairs of stacks.

9. The method of claim 1, wherein insulation between the conductive gates and the substrate in the HV device area is thicker than insulation between the conductive gates and the substrate in the core device area.

10. The method of claim 1, wherein the forming of the conductive gates further comprises:
    forming a third insulation layer directly on the substrate in the core device and HV device areas;
    removing the third insulation layer in the core device area and
    forming a fourth insulation layer directly on the substrate in the core device area;

forming the conductive gates directly on the third insulation layer in the HV device area and directly on the fourth insulation layer in the core device area;

wherein the third insulation layer is thicker than the fourth insulation layer.

11. A method of forming a memory device, comprising:

providing a semiconductor substrate having a memory array area, a core device area and an HV device area;

forming a first conductive layer over and insulated from the substrate in the memory array, core device, and HV device areas;

forming a second conductive layer over and insulated from the first conductive layer in the memory array, core device, and HV device areas;

forming a first insulation layer over the second conductive layer in the memory array, core device, and HV device areas;

etching through portions of the first insulation layer and the first and second conductive layers in the memory array area to form pairs of stacks, wherein each of the stacks includes a block of the second conductive layer over and insulated from a block of the first conductive layer;

forming source regions in the substrate, wherein each of the source regions is disposed between the stacks of one of the pairs of stacks;

forming a third conductive layer in the memory array, core device and HV device areas;

removing the third conductive layer from the core device and HV device areas;

forming a second insulation layer over the third conductive layer in the memory array area and over the first insulation layer in the core device and HV device areas;

removing the first and second insulation layers, and the first and second conductive layers, from the core device and HV device areas;

forming a fourth conductive layer disposed over and insulated from the substrate in the core device and HV device areas;

removing the second insulation layer in the memory array area;

removing portions of the third conductive layer to form blocks of the third conductive layer adjacent to and insulated from the pairs of stacks;

removing portions of the fourth conductive layer to form conductive gates disposed over and insulated from the substrate in the core device and HV device areas;

forming drain regions in the substrate adjacent the blocks of the third conductive layer in the memory array area; and forming second source and second drain regions in the substrate adjacent the conductive gates in the core device and HV device areas.

12. The method of claim 11, wherein the first insulation layer is oxide, nitride or a composite of oxide and nitride.

13. The method of claim 11, wherein the second insulation layer is oxide, nitride or a composite of oxide and nitride.

14. The method of claim 11, wherein the first, second and third conductive layers are polysilicon.

15. The method of claim 11, wherein the fourth conductive layer is polysilicon.

16. The method of claim 11, wherein the fourth conductive layer is metal.

17. The method of claim 16, wherein the fourth conductive layer is insulated from the substrate by a high K material.

18. The method of claim 11, wherein the removing the third conductive layer from the core device and HV device areas further comprises:

removing a top portion of the third conductive layer from the memory array area, resulting in a plurality of blocks of the third conductive each disposed between the stacks of one of the pairs of stacks.

19. The method of claim 11, wherein insulation between the conductive gates and the substrate in the HV device area is thicker than insulation between the conductive gates and the substrate in the core device area.

20. The method of claim 11, wherein the forming of the conductive gates further comprises:

forming a third insulation layer directly on the substrate in the core device and HV device areas;

removing the third insulation layer in the core device area and forming a fourth insulation layer directly on the substrate in the core device area;

forming the fourth conductive layer directly on the third insulation layer in the HV device area and directly on the fourth insulation layer in the core device area;

wherein the third insulation layer is thicker than the fourth insulation layer.

* * * * *